United States Patent
Myung et al.

(10) Patent No.: US 9,768,806 B2
(45) Date of Patent: Sep. 19, 2017

(54) PARITY CHECK MATRIX GENERATING METHOD, ENCODING APPARATUS, ENCODING METHOD, DECODING APPARATUS AND DECODING METHOD USING THE SAME

(71) Applicant: SAMSUNG ELECTRONICS CO., LTD., Suwon-si (KR)

(72) Inventors: Se-ho Myung, Yongin-si (KR); Hong-sil Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 84 days.

(21) Appl. No.: 14/794,243

(22) Filed: Jul. 8, 2015

(65) Prior Publication Data
US 2016/0013809 A1    Jan. 14, 2016

(30) Foreign Application Priority Data

Jul. 8, 2014    (KR) ..................... 10-2014-0084995

(51) Int. Cl.
*H03M 13/00*    (2006.01)
*H03M 13/11*    (2006.01)
(Continued)

(52) U.S. Cl.
CPC .... *H03M 13/1177* (2013.01); *H03M 13/1165* (2013.01); *H03M 13/255* (2013.01);
(Continued)

(58) Field of Classification Search
None
See application file for complete search history.

(56) References Cited

U.S. PATENT DOCUMENTS 7,318,186 B2    1/2008  Yokokawa et al.
7,536,623 B2 *  5/2009  Kim ..................... H03M 13/116
                                                        714/752
(Continued)

FOREIGN PATENT DOCUMENTS

KR    10-2008-0095302 A    10/2008
KR    10-2010-0099127 A     9/2010
(Continued)

OTHER PUBLICATIONS

Communication dated Oct. 28, 2015 issued by the International Searching Authority in counterpart International Application No. PCT/KR2015/007061.

(Continued)

*Primary Examiner* — Daniel McMahon
(74) *Attorney, Agent, or Firm* — Sughrue Mion, PLLC

(57) ABSTRACT

Provided is a data processing method which includes: encoding information word bits to generate parity bits based on a parity check matrix of a low density parity check (LDPC) code; interleaving a codeword comprising the input bits and the parity bits; and mapping the interleaved codeword into constellation points, wherein each of the constellation points corresponds to a modulation symbol, the parity check matrix is divided into a plurality of groups based on a number of bits included in the modulation symbol, and a sum of elements at a same position in each of the plurality of groups is less than 2.

20 Claims, 25 Drawing Sheets

(51) Int. Cl.
*H03M 13/27* (2006.01)
*H03M 13/25* (2006.01)

(52) U.S. Cl.
CPC ..... *H03M 13/271* (2013.01); *H03M 13/2792* (2013.01); *H03M 13/616* (2013.01)

(56) References Cited

U.S. PATENT DOCUMENTS

| | | |
|---|---|---|
| 7,590,186 B2 | 9/2009 | Yu et al. |
| 8,489,956 B2 | 7/2013 | Yokokawa et al. |
| 2005/0046602 A1 | 3/2005 | Hayami |
| 2005/0149845 A1* | 7/2005 | Shin .................. H03M 13/033 714/801 |
| 2007/0204198 A1* | 8/2007 | Kyung ................ H03M 13/116 714/758 |
| 2009/0187811 A1 | 7/2009 | Eroz et al. |
| 2009/0249159 A1 | 10/2009 | Lee et al. |
| 2010/0251061 A1* | 9/2010 | Okamura ........... H03M 13/1102 714/752 |
| 2011/0299381 A1 | 12/2011 | Ge et al. |
| 2013/0173982 A1 | 7/2013 | Moon et al. |
| 2015/0006989 A1 | 1/2015 | Doi et al. |
| 2016/0094246 A1* | 3/2016 | Vasista Srinivasan Ranganathan ..... H03M 13/1171 714/776 |

FOREIGN PATENT DOCUMENTS

| | | |
|---|---|---|
| KR | 10-1221901 B1 | 1/2013 |
| WO | 2013136523 A1 | 9/2013 |

OTHER PUBLICATIONS

Min Jang, et al; "On the Design of LDPC coded BICM in DVB Broadcasting Systems with Block Permutations"; IEEE Transactions on Broadcasting; vol. 61; No. 2; Feb. 24, 2015; 10 pgs. total.

* cited by examiner

FIG. 2

$C = (x_0, x_1, x_2 \ldots x_7)$ $$H = \begin{bmatrix} \overbrace{x_0\ x_1\ x_2\ x_3\ x_4}^{\text{INFORMATION WORD}} & \overbrace{x_5\ x_6\ x_7}^{\text{PARITY}} \\ 1\ 1\ 1\ 1\ 1 & 1\ 0\ 0 \\ 1\ 1\ 0\ 1\ 0 & 1\ 1\ 0 \\ 1\ 1\ 1\ 0\ 0 & 0\ 1\ 1 \\ 1\ 0\ 1\ 1\ 1 & 0\ 0\ 1 \end{bmatrix}$$

PARITY CHECK EQUATION $x_0+x_1+x_2+x_3+x_4+x_5=0$
$x_0+x_1+x_3+x_5+x_6=0$
$x_0+x_1+x_2+x_6+x_7=0$
$x_0+x_2+x_3+x_4+x_7=0$

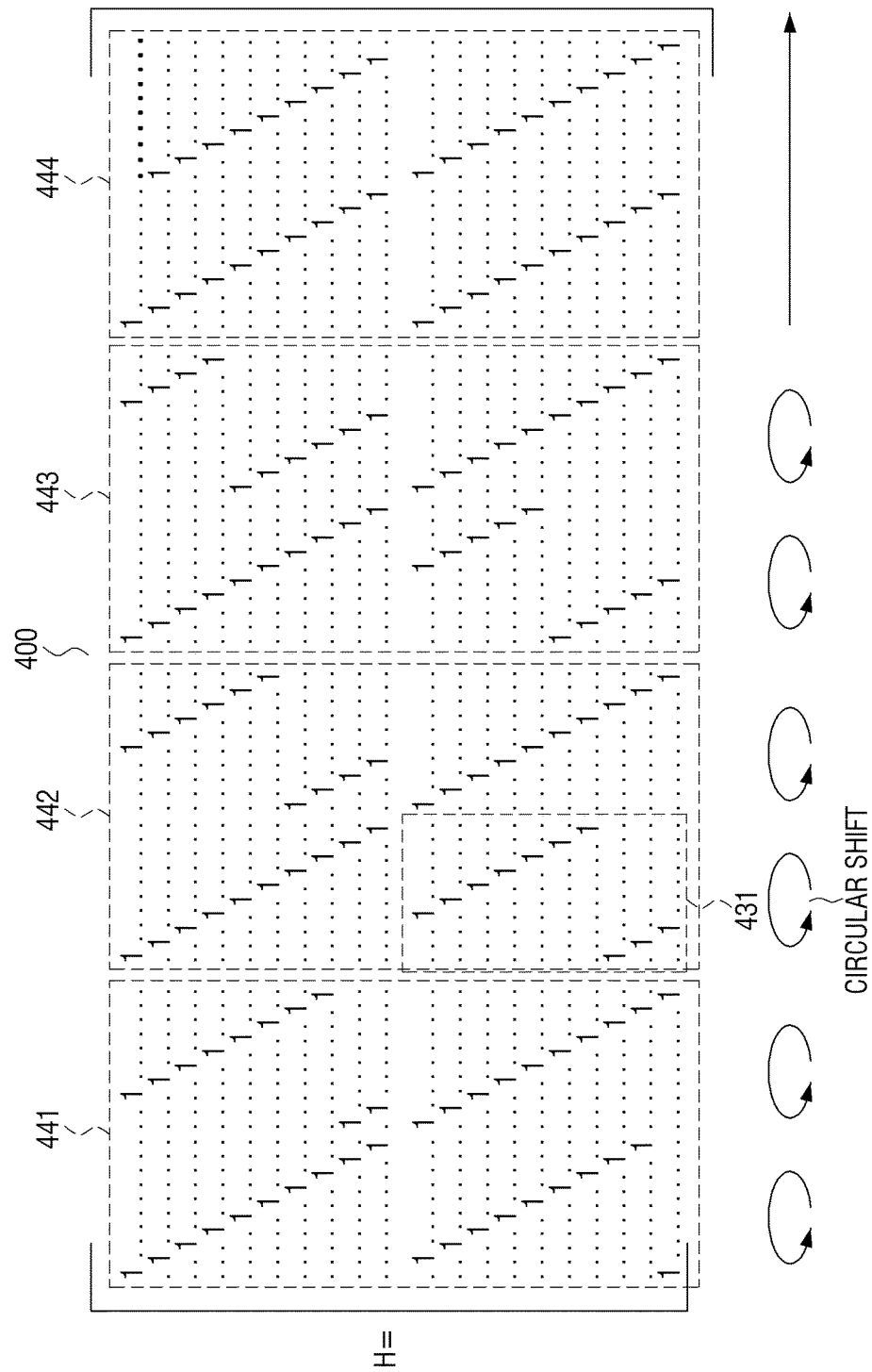

PARITY CHECK MATRIX GENERATING METHOD, ENCODING APPARATUS, ENCODING METHOD, DECODING APPARATUS AND DECODING METHOD USING THE SAME

CROSS-REFERENCE TO THE RELATED APPLICATION

This application claims priority from Korean Patent Application No. 10-2014-0084995, filed on Jul. 8, 2014 in the Korean Intellectual Property Office, the disclosure of which is incorporated herein by reference in its entirety.

BACKGROUND

1. Field

Methods and apparatuses consistent with what is disclosed herein relate to generation of a parity check matrix and low density parity check (LDPC) encoding and decoding using the parity check matrix in signal transmission and reception such as broadcasting communication.

2. Description of the Related Art

In the 21st century, the broadcasting communication of this information-oriented society requires full-scale digitization, multi-channel, wide-band, and high quality services.

The recently expanded distribution of the high definition digital television (TV) and personal media player (PMP), and portable broadcast device has further increased demands to a digital broadcasting service for more varied ways of reception. To meet such demands, standardization groups have implemented a variety of standards and made efforts to enable provision of a variety of services to users.

Meanwhile, signal transmitting and receiving apparatuses that provide users with digital broadcast services according to the standards have a shortcoming of increased complexity because these devices have to include various components in order to generate signals to meet the formats as required by the standards.

SUMMARY

Exemplary embodiments of the present inventive concept are provided to address the above disadvantages.

Exemplary embodiment of the inventive concept provide a parity check matrix generating method for generating a parity check matrix, which can simplify signal processing, and an encoding apparatus, an encoding method, a decoding apparatus and a decoding method using the same.

According to an exemplary embodiment, there is provided a method of low density parity check (LDPC) encoding which may include: receiving a plurality of information word bits; LDPC encoding the information word bits using a parity check matrix in which a sum of elements in same positions in a plurality of groups constituting the parity check matrix is less than 2; and generating LDPC codeword bits including the information word bits and parity bits as a result of the LDPC encoding, wherein each of the plurality of groups constituting includes a same number of columns.

The number of the plurality of groups may be an integer multiple of a number of bits constituting a modulation symbol to be generated from the LDPC codeword bits.

Some bits among the LDPC codeword bits corresponding to different parity check equations may constitute the modulation symbol, wherein each of the parity check equations may be formed of bits corresponding to columns where 1 exists in a row in the parity check matrix.

Any two neighboring bits among the bits constituting the modulation symbol may be separated by a predetermined interval.

The above LDPC encoding method may further include generating the parity check matrix by performing row permutation and column permutation on a preset parity check matrix; dividing the parity check matrix, on which the row permutation and the column permutation are performed, into the plurality of groups according to a modulation mode; and shifting elements of at least one of sub-groups formed of columns corresponding to the information word bits in at least one of the plurality of groups so that the sum of the elements in the same positions of the plurality of groups is less than 2.

At least one of the sub-groups may include a matrix with a circulant permutation matrix structure.

Each of the plurality of groups may include a matrix which is generated by dividing the parity check matrix into a preset number according to the modulation mode, and each of the sub-groups may include a matrix having a size obtained by dividing a difference between a number of the LDPC codeword bits and a number of the information word bits by a predetermined constant.

The preset parity check matrix may include a plurality of column groups corresponding to the information word bits and comprising a same number of columns, and the predetermined constant may be a number of bits by which each column included in each column group is cyclic-shifted from a previous column in the column group.

Each of the plurality of groups may be a square matrix in which a number of columns constituting the square matrix is the same as a number of rows constituting the square matrix.

According to an exemplary embodiment, there is provided an encoding apparatus is provided which may include: an encoder configured to receive a plurality of information word bits and generate LDPC codeword bits by performing LDPC encoding on the information word bits using a parity check matrix in which a sum of elements in same positions in a plurality of groups constituting the parity check matrix is less than 2, wherein the LDPC codeword bits includes the information word bits and parity bits, and wherein each of the plurality of groups constituting comprises a same number of columns.

The number of the plurality of groups may be an integer multiple of a number of bits constituting a modulation symbol to be generated from the LDPC codeword bits.

Some bits among the LDPC codeword bits corresponding to different parity check equations may constitute the modulation symbol, wherein each of the parity check equations is formed of bits corresponding to columns where 1 exists in a row in the parity check matrix.

The bits constituting the modulation symbol may be separated by a same predetermined interval in the LDPC codeword bits.

The parity check matrix may be generated by dividing a preset parity check matrix into the plurality of groups according to a modulation mode, and shifting elements of at least one of sub-groups formed of columns corresponding to the information word bits in at least one of the plurality of groups so that the sum of the elements in the same positions of the plurality of groups is less than 2.

At least one of the sub-groups may include a matrix with a circulant permutation matrix structure.

Each of the plurality of groups may include a matrix which is generated by dividing the parity check matrix into a preset number according to the modulation mode, and each of the sub-groups may include a matrix having a size obtained by dividing a difference between a number of the LDPC codeword bits and a number of the information word bits by a predetermined constant.

The preset parity check matrix may include a plurality of column groups corresponding to the information word bits and comprising a same number of columns, and the predetermined constant may be a number of bits by which each column included in each column group is cyclic-shifted from a previous column in the column group.

The preset parity check matrix may be row and column permuted before the above dividing.

Each of the plurality of groups may be a square matrix in which a number of columns constituting the square matrix is the same as a number of rows constituting the square matrix.

According to an exemplary embodiment, there is provided a decoding apparatus which may include: a decoder configured to receive a signal comprising LDPC codeword bits and perform LDPC decoding on the signal using a parity check matrix, in which a sum of elements in same positions in a plurality of groups constituting the parity check matrix is less than 2.

The parity check matrix may be generated by dividing a preset parity check matrix into the plurality of groups according to a modulation mode, and shifting elements of at least one of sub-groups formed of columns corresponding to the information word bits in at least one of the plurality of groups so that the sum of the elements in the same positions of the plurality of groups is less than 2.

The at least one of the sub-groups may include a matrix with a circulant permutation matrix structure.

Each of the plurality of groups may include a matrix which is generated by dividing the parity check matrix into a preset number according to the modulation mode, and each of the sub-groups may include a matrix having a size obtained by dividing a difference between a number of the LDPC codeword bits and a number of the information word bits by a predetermined constant.

The preset parity check matrix may include a plurality of column groups corresponding to the information word bits and including a same number of columns, and the predetermined constant may be a number of bits by which each column included in each column group is cyclic-shifted from a previous column in the column group.

According to an exemplary embodiment, there is provided an LDPC decoding method which may include: receiving a signal comprising LDPC codeword bits; and performing a low density parity check (LDPC) decoding based on a parity check matrix. The parity check matrix may be a parity check matrix in which a sum of values existing in at least one same position in each of a plurality of groups is below 2.

The parity check matrix may be generated by dividing a preset parity check matrix into the plurality of groups according to a modulation mode, and shifting elements of at least one of sub-groups formed of columns corresponding to the information word bits in at least one of the plurality of groups so that the sum of the elements in the same positions of the plurality of groups is less than 2. At least one of the sub-groups may include a matrix with a circulant permutation matrix structure.

Each of the plurality of groups may include a matrix which is generated by dividing the parity check matrix into a preset number according to the modulation mode, and each of the sub-groups may include a matrix having a size obtained by dividing a difference between a number of the LDPC codeword bits and a number of the information word bits by a predetermined constant. The preset parity check matrix may include a plurality of column groups corresponding to the information word bits and including a same number of columns, and the predetermined constant may be a number of bits by which each column included in each column group is cyclic-shifted from a previous column in the column group.

Accordingly, signal processing can be simplified when performing LDPC decoding using the parity check matrix.

BRIEF DESCRIPTION OF THE DRAWINGS

The above and/or other aspects of the present inventive concept will be more apparent by describing certain exemplary embodiments with reference to the accompanying drawings, in which:

FIG. 2 is a diagram provided to explain a parity check equation according to an exemplary embodiment;

FIGS. 4A to 4E are diagrams provided to explain a parity check matrix generating method according to exemplary embodiments;

FIGS. 15A and 15B are diagrams provided to explain a parity check matrix according to an exemplary embodiment;

DETAILED DESCRIPTION OF THE EXEMPLARY EMBODIMENTS

Figure 1:
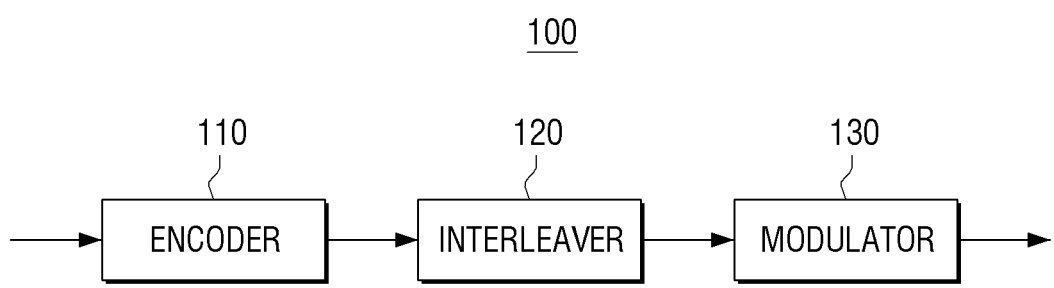
FIG. 1 is a block diagram provided to explain a structure of a transmitting apparatus according to an exemplary embodiment.

Certain exemplary embodiments of the inventive concept will now be described in greater detail with reference to the accompanying drawings.

In the following descriptions, same or like drawing reference numerals are used for the same or like elements even in different drawings. The matters defined in the description, such as detailed construction and elements, are provided to assist in a comprehensive understanding of the inventive concept. Accordingly, it is apparent that the exemplary embodiments of the inventive concept can be carried out without those specifically defined matters. Also, well-known functions or constructions are not described in detail since they would obscure the invention with unnecessary detail.

Also in the following descriptions, the lengths of a low density parity check (LDPC) codeword, information word bits and parity bits respectively represent a number of bits that are included in the LDPC codeword, the information word bits, and the parity bits, respectively.

FIG. 1 is a block diagram provided to explain a structure of a transmitting apparatus according to an exemplary embodiment. Referring to FIG. 1, the transmitting apparatus 100 includes an encoder 110, an interleaver 120, and a modulator 130 (or constellation mapper).

The encoder 110 performs LDPC encoding on input bits (i.e., data) which are information word bits. To this purpose, the encoder 110 may include an LDPC encoder (not illustrated) for the LDPC encoding.

To be specific, the encoder 110 may perform the LDPC encoding on the information word bits to generate parity bits (i.e., LDPC parity bits), and generate an LDPC codeword which includes the information word bits and the parity bits. For example, the LDPC codeword may include $N_{ldpc}$ bits, including information word bits having $K_{ldpc}$ bits and parity bits having $N_{ldpc}-K_{ldpc}$ bits.

The encoder 110 may use a parity check matrix for the LDPC encoding. That is, considering that the LDPC encoding is a process to generate an LDPC codeword C which satisfies $H \cdot C^T = 0$ with respect to a parity check matrix H, the encoder 110 may use the parity check matrix H for the LDPC encoding.

The transmitting apparatus 100 may store in advance information about a parity check matrix to use the parity check matrix in LDPC encoding. A structure of the parity check matrix and a method of generating the parity check matrix according to an exemplary embodiment will be explained below.

The encoder 110 may perform LDPC encoding using various coding rates such as 5/15, 6/15, 4/9, 7/15, 8/15, 9/15, 10/15, 11/15, 12/15 and 13/15 not being limited thereto, and may generate LDPC codewords of various lengths such as 16200, 64800, etc. based on a length and a coding rate of information word bits constituting an LDPC codeword.

Further, the encoder 110 may perform not only the LDPC encoding but also Bose, Chaudhuri, Hocquenghem (BCH) encoding. To this end, the encoder 110 may additionally include a BCH encoder (not illustrated) for the BCH encoding.

The encoder 110 may generate a BCH codeword by performing BCH encoding with respect to input bits, and generate an LDPC codeword by performing LDPC encoding on the BCH codeword as information word bits.

The interleaver 120 interleaves an LDPC codeword. That is, the interleaver 120 may interleave the LDPC codeword output from the encoder 110.

For example, the interleaver 120 may perform parity interleaving and column interleaving on the LDPC codeword.

First, the interleaver 120 may perform interleaving on the parity bits. That is, the interleaver 120 may interleave only the parity bits, among the information word bits and the parity bits that constitute the LDPC codeword. For example, using Mathematical Formula 1 below, the interleaver 120 may interleave only the parity bits of the LDPC codeword which is represented by $C = (c_0, c_1, \ldots, c_{N_{ldpc}-1})$, and generate a parity-interleaved LDPC codeword $U = (u_0, u_1, \ldots, u_{N_{ldpc}-1})$.

$$u_i = c_i$$

for $0 \leq i < K_{ldpc}$, and $$u_{K_{ldpc}+M \cdot t+s} = c_{K_{ldpc}+Q_{ldpc} \cdot s+t} \qquad \text{[Mathematical Formula 1]}$$

for $0 \leq s < M$, $0 \leq t < Q_{ldpc}$, where $K_{ldpc}$ denotes the length of the information word bits that constitute the LDPC codeword. Meanwhile, M and $Q_{ldpc}$ are parameters to define the structure of the parity check matrix, and these will be explained in detail below with reference to FIG. 3.

Additionally, the interleaver 120 may perform column interleaving. According to an exemplary embodiment, the interleaver 120 may interleave the parity-interleaved LDPC codeword, using $N_c$ columns each having $N_r$ rows, where $N_c$ and $N_r$ are an integer greater than 0.

To be specific, the interleaver 120 may perform the interleaving by writing the parity-interleaved LDPC codeword bits from column 1 to column $N_c$ in a column direction, and reading the columns written with the LDPC codeword bits from row 1 to row $N_r$ in a row direction. Accordingly, bits written to a same row of each column may be output sequentially.

The number of columns and rows used in the interleaving may be changed in various manners, according to the length of the LDPC codeword and a modulation mode. For example, the number of columns may be equal to the number of bits which constitute a modulation symbol, and the number of rows may be the length of the LDPC codeword divided by the number of columns.

Accordingly, the interleaver 120 may realign an order of the LDPC codeword bits by performing the interleaving.

As explained above, the interleaver 120 may perform both the parity interleaving and the column interleaving, but the inventive concept is not limited thereto. Accordingly, depending on exemplary embodiments, the parity interleaving may be omitted.

The modulator 130 may modulate the interleaved LDPC codeword. That is, the modulator 130 may modulate bits output from the interleaver 120.

To be specific, the modulator 130 may modulate the interleaved LDPC codeword by sequentially separating the interleaved LDPC codeword bits output from the interleaver 120 into a certain number of bits, and mapping these bits to a constellation. The certain number of bits may constitute a modulation symbol, and may be mapped to a constellation point in the constellation.

Meanwhile, the number of bits constituting a modulation symbol may vary depending on a modulation mode. For example, in the modulation modes of QPSK, 16-QAM, 64-QAM, 256-QAM, 1024-QAM and 4096-QAM, the number of bits constituting a modulation symbol may be 2, 4, 6, 8, 10 and 12, respectively.

Figure 11:
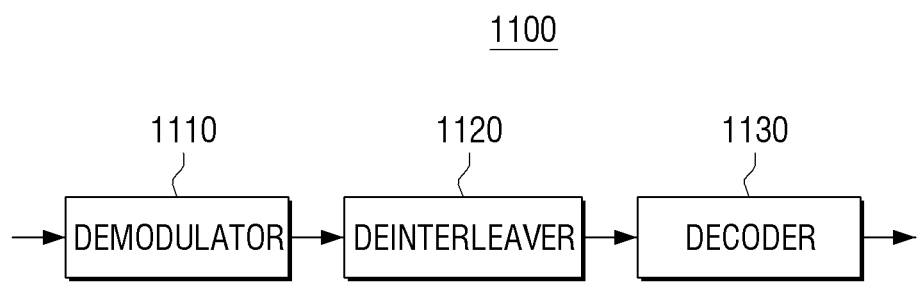
FIG. 11 is a block diagram provided to explain a structure of a receiving apparatus according to an exemplary embodiment.

The transmitting apparatus 100 may send the modulation symbol to a receiving apparatus 1100 (FIG. 11). For example, using the Orthogonal Frequency Division Multiplexing (OFDM), the modulator 130 may map the modulation symbol to an OFMD frame, and transmit this to the receiving apparatus 1100 through an allocated channel.

The modulator 130 may map the interleaved LDPC codeword to modulation symbols such that LDPC codeword bits corresponding to different parity check equations can constitute one modulation symbol.

To be specific, the modulator 130 sequentially map a predetermined number of LDPC codeword bits output from the interleaver 120 to a modulation symbol. Further, the interleaver 120 sequentially writes the LDPC codeword bits output from the encoder 110 to a plurality of columns, and sequentially outputs, from the plurality of columns, the LDPC codeword bits written to a same row. Accordingly, when the number of bits mapped to a modulation symbol is equal to the number of columns of the interleaver 120, the LDPC codeword bits output from a same row may be mapped to a same modulation symbol.

Meanwhile, among the LDPC codeword bits output from the encoder 110, bits which are separated by a predetermined interval, e.g., by the number of rows ($N_r$) of the interleaver 120, may be respectively written to a same row of a plurality of columns ($N_c$) of the interleaver 120.

Accordingly, among the LDPC codeword bits, when bits separated at the predetermined interval correspond to different parity check equations, respectively, these bits may be mapped to a same modulation symbol. Accordingly, in order to generate an LDPC codeword which satisfies this condition, the encoder 110 may perform LDPC encoding using a parity check matrix having a specific structure. Hereinbelow, the structure of such parity check matrix and a method of generating the same will be explained in detail.

First, based on FIG. 2, a parity check equation will be explained.

FIG. 2 is a diagram provided to explain a parity check equation according to an exemplary embodiment. To be specific, FIG. 2 shows a parity check matrix H formed of 4 rows and 8 columns and a corresponding parity check equation.

Referring to FIG. 2, since the parity check matrix H has 8 columns, an LDPC codeword C generated based on the parity check matrix H has a length of 8 (i.e., 8 bits).

Each column of the parity check matrix H corresponds to each of 8 bits which are LDPC encoded. That is, in an LDPC codeword, information word bits ($x_0$, $x_1$, $x_2$, $x_3$, $x_4$) correspond to 0th to 4th columns of the parity check matrix H, respectively, and parity bits ($x_5$, $x_6$, $x_7$) correspond to 5th to 7th columns of the parity check matrix H, respectively.

Considering that a parity check equation is a mathematical formula that constitutes $H \cdot C^T = 0$, the parity check equation may be determined by the parity check matrix H. For example, referring to FIG. 2, parity check equations may be expressed as $x_0+x_1+x_2+x_3+x_4+x_5=0$, $x_0+x_1+x_3+x_5+x_6=0$, $x_0+x_1+x_2+x_6+x_7=0$, $x_0+x_2+x_3+x_4+x_7=0$, where + denotes a binary operation (i.e., modulo-2).

Accordingly, one parity check equation is constructed with LDPC codeword bits which correspond to a same row of the parity check matrix H, at a column where '1' exists. For example, a parity check equation $x_0+x_1+x_2+x_3+x_4+x_5=0$ is constructed by the binary operation of the information word bits $x_0$, $x_1$, $x_2$, $x_3$, $x_4$ corresponding to the columns (i.e., columns 0, 1, 2, 3, 4) having 1 in the first row of the parity check matrix H, and the parity bit $x_5$ corresponding to column 5.

As explained above, in order for LDPC codeword bits corresponding to different parity check equations to constitute one modulation symbol, bits separated by a predetermined interval in the LDPC codeword bits have to correspond to different parity check equations, respectively.

Meanwhile, the LDPC codeword bits correspond to respective columns of the parity check matrix, and a parity check equation is constructed with or formed of bits corresponding to columns where 1 exists, at a row of the parity check matrix, from among the LDPC codeword bits.

Accordingly, when only one of elements separated at same predetermined intervals in each row of the parity check matrix has 1, that is, when a sum of elements separated at the same predetermined intervals in each row of the parity check matrix is less than 2, one modulation symbol may be formed of bits corresponding to different parity check equations from among the LDPC codeword bits.

Meanwhile, a structure in which only one of the elements separated at the same predetermined intervals in each row of the parity check matrix has value 1 indicates that a sum of elements existing at same positions in a plurality of groups of the parity check matrix is less than 2. This is true because when the parity check matrix is divided into a plurality of groups each having a same number of columns, same locations in the plurality of groups would be the elements separated at a predetermined interval from one another in the parity check matrix.

Hereinbelow, a method of generating a parity check matrix to be used for LDPC encoding which constitutes a modulation symbol to satisfy the above-described condition will be explained in detail with reference to FIGS. 3 to 5.

According to an exemplary embodiment, a parity check matrix, in which only one of elements separated at same predetermined intervals in each row has 1, can be generated by controlling a parity check matrix to have a particular structure. Referring to FIG. 3, a structure of a parity check matrix used for generating the above-described parity check matrix will be explained, according to an exemplary embodiment.

Figure 3:
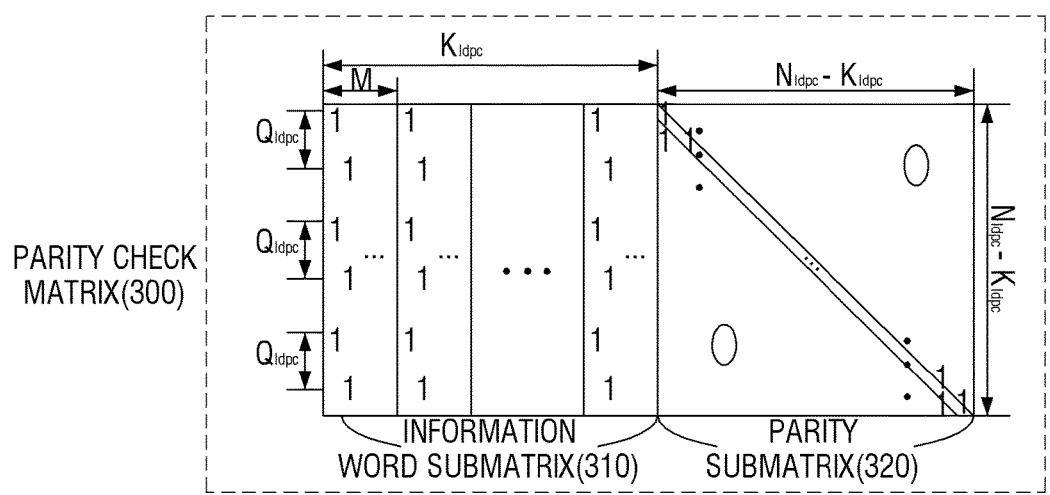
FIG. 3 is a diagram provided to explain a basic structure of a parity check matrix according to an exemplary embodiment.

Referring to FIG. 3, a parity check matrix 300 according to an exemplary embodiment is formed of information word sub-matrix 310 (or, information word matrix) which is a sub-matrix corresponding to information word bits of an LDPC codeword, and parity sub-matrix 320 (or, parity matrix) which is a sub-matrix corresponding to parity bits of the LDPC codeword. In the parity check matrix 300, elements other than 1 are 0.

The information word sub-matrix 310, which is formed of $K_{ldpc}$ columns (i.e., from column 0 to column $K_{ldpc}-1$), follows the rules as described below.

First, the $K_{ldpc}$ columns constituting the information word sub-matrix 310 are divided into a plurality of groups each having M columns, thereby generating a total of $K_{ldpc}/M$ column groups. In a same column group, each column is cyclic shifted from a previous column by $Q_{ldpc}$.

Here, M denotes an interval at which a same column pattern repeats in the information word sub-matrix 310, and $Q_{ldpc}$ is a size of the cyclic shift appearing in each column of the information word sub-matrix 310. Both M and $Q_{ldpc}$ are integers, and are determined to satisfy $Q_{ldpc}=(N_{ldpc}-K_{ldpc})/M$. The detailed values for M and $Q_{ldpc}$ may vary depending on a length and a coding rate of an LDPC codeword. Because $N_{ldpc}$ represents a length of the LDPC codeword, and $K_{ldpc}$ represents information word bits, $N_{ldpc}-K_{ldpc}$ may represent a length of the parity bits.

Second, when a degree (here, the 'degree' refers to the number of 1s existing in a column, and all columns belonging to a same column group have the same degree) of column 0 of column group i (i=0, 1, . . . , $K_{ldpc}$/M−1) is $D_i$, and positions of a row having 1 is $R_{i,0}^{(0)}$, $R_{i,0}^{(1)}$, . . . , $R_{i,0}^{(D_i-1)}$, it is possible to determine $R_{i,j}^{(k)}$, which is an index of a row at which $k^{th}$ weight−1 is located in column j of column group i (i.e., index of a row at which $k^{th}$ 1 is located in column j of column group i), as expressed by Mathematical Formula 2 below.

$$R_{i,j}^{(k)}=R_{i,(j-1)}^{(k)}+Q_{ldpc}\bmod(N_{ldpc}-K_{ldpc})\quad\text{[Mathematical Formula 2]}$$

where k=0,1,2, . . . ,$D_i$−1,i=0,1, . . . ,$K_{ldpc}$/M−1,j=1,2, . . . ,M−1.

Meanwhile, Mathematical Formula 2 may be equally expressed as Mathematical Formula 3 below.

$$R_{i,j}^{(k)}=\{R_{i,0}^{(k)}+(j\bmod M)\times Q_{ldpc}\}\bmod(N_{ldpc}-K_{ldpc})\quad\text{[Mathematical Formula 3]}$$

where k=0, 1, 2, . . . , $D_i$−1, i=0, 1, . . . , $K_{ldpc}$/M−1, j=1, 2, . . . , M−1.

In the above Mathematical Formulas, $R_{i,j}^{(k)}$ is an index of a row at which $k^{th}$ weight−1 is located in column j of column group i, $N_{ldpc}$ is a length of an LDPC codeword, $K_{ldpc}$ is a length of information word bits, $D_i$ is a degree of columns belonging to column group i, and M is the number of columns belonging to one column group.

Referring to Mathematical Formula 3, as long as $R_{i,0}^{(k)}$ is given, it is possible to know an index, i.e., a location, of a row at which $k^{th}$ weight−1 is located in column j of column group i. It is thus possible to know positions of a column and a row at which the weight−1 exists, in the information word sub-matrix 310 of the parity check matrix 300 as the one illustrated in FIG. 3, by storing the index value of the row at which the $k^{th}$ weight−1 exists in column 1 of each column group.

According to the above-mentioned rules, all the degrees of the columns belonging to a column group are the same (i.e., $D_i$). Accordingly, according to the above-mentioned rules, an LDPC code storing information about a parity check matrix may be briefly expressed as below.

For example, when $N_{ldoc1}$ is 30, $K_{ldpc1}$ is 15, and $Q_{ldpc1}$ is 3, information on positions of a row at which weight−1 exists in column 0 of three column groups may be expressed as sequences like Mathematical Formula 4 below, which may be referred to as 'weight−1 position sequence'.

$$R_{1,0}^{(1)}=1,\ R_{1,0}^{(2)}=2,\ R_{1,0}^{(3)}=8,\ R_{1,0}^{(4)}=10,$$

$$R_{2,0}^{(1)}=0,\ R_{2,0}^{(2)}=9,\ R_{2,0}^{(3)}=13,$$

$$R_{3,0}^{(1)}=0,\ R_{3,0}^{(2)}=14.\quad\text{[Mathematical Formula 4]}$$

where $R_{i,j}^{(k)}$ denotes an index of a row at which $k^{th}$ weight−1 exists in column j of column group i.

Meanwhile, the sequences of the positions of weight−1 like those in Mathematical Formula 4, which express the index of the row at which 1 exists in column 0 of the respective column groups, may be more simplified as in Table 1 below.

TABLE 1

1 2 8 10
0 9 13
0 14

Table 1 represents the positions of the weight−1 in the parity check matrix, i.e., positions of the elements having value 1, and the position sequence of the $i^{th}$ weight−1 may be expressed by the indexes of the rows at which weight−1 exists in column 0 belonging to the column group i.

The parity sub-matrix 320 is a sub-matrix containing $N_{ldpc}-K_{ldpc}$ columns (i.e., containing column $K_{ldpc}$ to column $N_{ldpc}$−1), which has a dual diagonal structure. Accordingly, the degrees of all columns except for the last column in the parity sub-matrix 320 are 2, and the degree of the last column (i.e., column $N_{ldpc}$−1) is 1.

Accordingly, the parity check matrix as the one illustrated in FIG. 3 can be defined according to the above-mentioned rules.

Herebelow, with reference to FIGS. 4A to 4E, and using the parity check matrix with the structure illustrated in FIG. 3, a parity check matrix in which only one of the elements separated at same predetermined intervals in each of the respective rows has 1, will be explained.

Figure 4A:
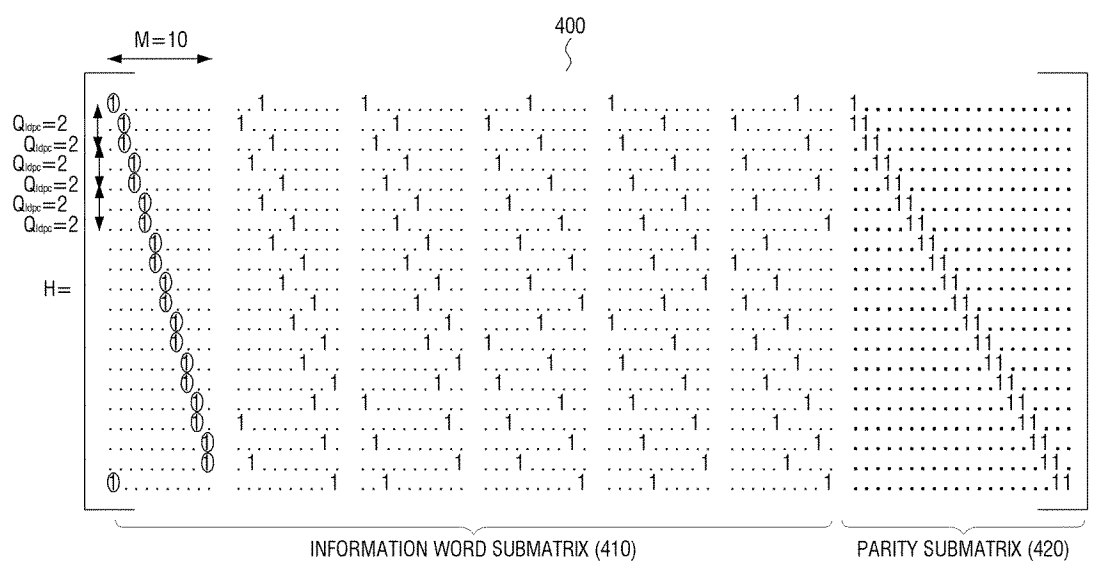

For convenience of explanation, FIG. 4A shows a preset parity check matrix (i.e., the parity check matrix which may have the structure shown in FIG. 3 and used for generating a parity check matrix in which only one of the elements separated at the same predetermined intervals in each of the respective rows has 1 according to an exemplary embodiment). Referring to FIG. 4A, the parity check matrix 400 contains information word sub-matrix 410 containing 60 columns (=$K_{ldpc}$) and parity sub-matrix 420 containing 20 columns (=$N_{ldpc}-K_{ldpc}$), where M=10, and $Q_{ldpc}$=($N_{ldpc}-K_{ldpc}$)/M=20/10=2.

First, with respect to the preset parity check matrix formed of the information word sub-matrix and the parity sub-matrix, row permutation and column permutation are performed.

The row permutation changes an order of rows of the preset parity check matrix, and may be performed based on Mathematical Formula 5.

$$Q_{ldpc}\cdot i+j\Rightarrow M\cdot j+i(0\leq i<M,0\leq j<Q_{ldpc})\quad\text{[Mathematical Formula 5]}$$

That is, with respect to row X, i, j that satisfy X=$Q_{ldpc}$×i+j are calculated, and the calculated i, j are substituted for M×j+i to calculate a row to which row X is permuted. Row X may then be changed with the row that is calculated based on Mathematical Formula 5 by row permutation, although this is only one of examples. Accordingly, the row permutation may be performed in a variety of manners.

Figure 4B:
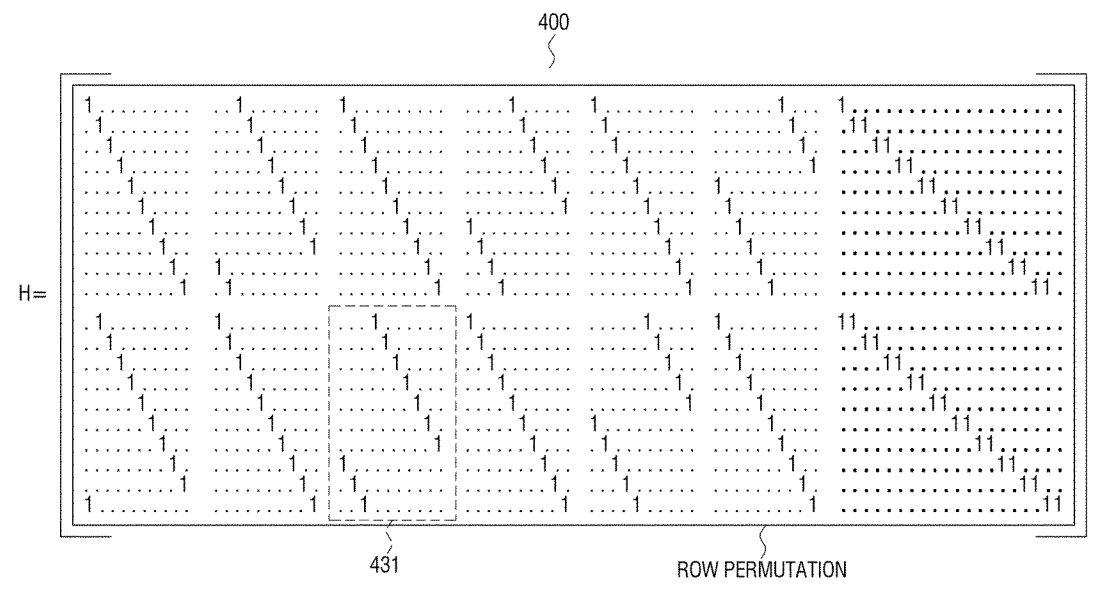

As the row permutation is performed on the parity check matrix 400 of FIG. 4A in this manner, the parity check matrix 400 of FIG. 4B may be generated.

The above-described row permutation continues until each of a plurality of sub-groups (or, sub-blocks) constituting the information word sub-matrix respectively becomes a circulant permutation matrix or superposed circulant permutation matrix structure. Accordingly, as illustrated in FIG. 4B, a sub-group 431 among the sub-groups of the parity check matrix 400 may be a matrix with the circulant permutation matrix structure.

The circulant permutation matrix is a square matrix, which may have a structure in which the unit matrix (or, identity matrix) is cyclic shifted. Accordingly, the degrees of the respective columns and rows of the circulant permutation matrix are 1. For example, a circulant permutation matrix P, which is cyclic shifted to the right by unit 1, may be expressed by Mathematical Formula 6 below.

$$P = \begin{bmatrix} 0 & 1 & 0 & & 0 \\ 0 & 0 & 1 & \cdots & 0 \\ \vdots & \vdots & \vdots & & \vdots \\ 0 & 0 & 0 & \cdots & 1 \\ 1 & 0 & 0 & & 0 \end{bmatrix}$$ [Mathematical Formula 6]

Meanwhile, a sub-group may be a square matrix of a predetermined size. To be specific, the sub-group may be a matrix which has a size obtained by dividing a difference between a length of an LDPC codeword generated based on the parity check matrix and a length of information word bits of the LDPC codeword by a predetermined constant. The predetermined constant may be $Q_{ldpc}$.

That is, a sub-group may be formed of $(N_{ldpc}-K_{ldpc})/Q_{ldpc}=M$ columns, and thus, may be an M×M square matrix. For example, as illustrated in FIG. 4B, the sub-group 431 may be a 10×10 square matrix.

After the row permutation in the manner described above, column permutation may be performed on the row permuted parity check matrix. The column permutation changes an order of columns of the parity check matrix, and may be performed based on Mathematical Formula 7 below.

$$K_{ldpc}+Q_{ldpc}\cdot k+l \Rightarrow K_{ldpc}+M\cdot l+k \quad (0 \le k < M, 0 \le l < Q_{ldpc})$$ [Mathematical Formula 7]

That is, with respect to column X, k, l that satisfy $X=K_{ldpc}+Q_{ldpc}\times k+l$ are calculated, and the calculated k, l are substituted for $K_{ldpc}+M\times l+k$ to calculate a column to which column X is permuted. Then by changing column X with the column calculated based on Mathematical Formula 7, the column permutation may be performed.

Considering that $K_{ldpc}$ is the length of the information word bits, the column permutation may be performed only on the columns included in the parity sub-matrix.

As the parity check matrix 400 of FIG. 4B is column permuted in the manner described above, the parity check matrix 400 of FIG. 4C may be generated.

Considering that the column permutation corresponds to parity interleaving performed at the interleaver 120, it is performed only on a portion corresponding to the parity bits in the parity check matrix 400, i.e., the parity sub-matrix, by applying the same interleaving manner as that which is applied to the parity interleaving, such as Mathematical Formula 1 and Mathematical Formula 7.

Figure 4C:
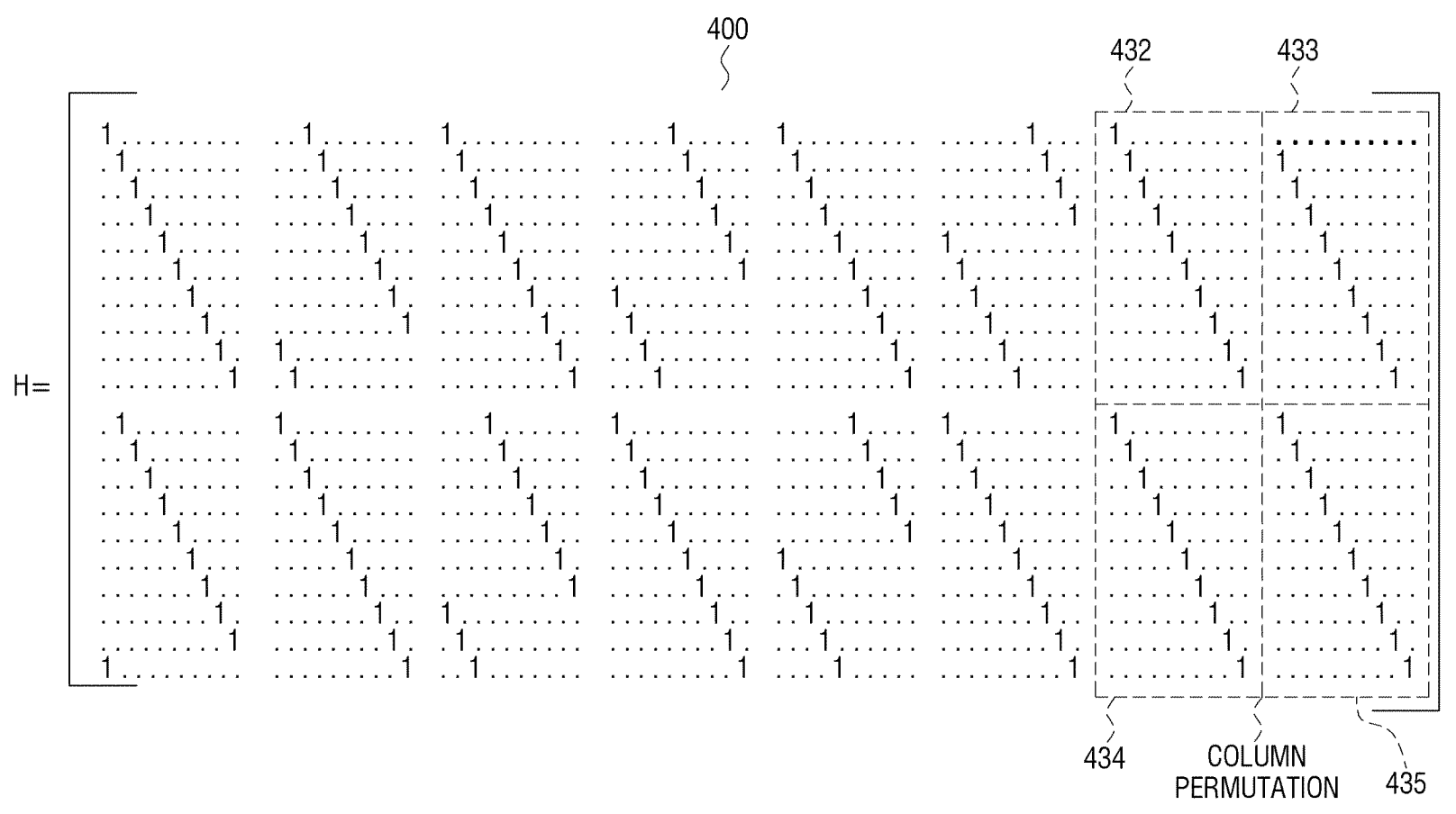

As a result of performing permutation in the manner explained above, the entire parity check matrix 400 is divided into a plurality of blocks, each of which will have a form that corresponds to an M×M quasi-cyclic matrix. An example is shown in FIG. 4C.

Because the parity check matrix 400 is constructed in M×M quasi-cyclic matrix unit, M columns may be named 'column-block', and M rows may be named 'row-block'. That is, the parity check matrix 400 may be formed of $N_{qc\_column}=N_{ldpc}/M$ column-blocks and $N_{qc\_row}=N_{parity}/M$ row-blocks. For example, the parity check matrix 400 of FIG. 4C may be formed of $N_{qc\_column}=80/10=8$ column-blocks and $N_{qc\_row}=20/10=2$ row-blocks.

Herebelow, M×M matrices constituting the parity check matrix 400 of FIG. 4C will be explained in greater detail.

First, an M×M matrix (e.g., 433 in FIG. 4C) in column $(N_{qc\_column}-1)$ of row 0 has a form as represented by Mathematical Formula 8 below.

$$A = \begin{bmatrix} 0 & 0 & \cdots & 0 & 0 \\ 1 & 0 & \cdots & 0 & 0 \\ 0 & 1 & \cdots & 0 & 0 \\ \vdots & \vdots & \vdots & \vdots & \vdots \\ 0 & 0 & \cdots & 1 & 0 \end{bmatrix}$$ [Mathematical Formula 8]

In an M×M matrix of Mathematical Formula 8, all elements of row 0, column (M−1) are '0'. When $0 \le i \le (M-2)$, all elements of column i, row (i+1) are '1', while the other elements are '0'.

Second, in the parity sub-matrix of the parity check matrix 400, when $0 \le i \le (N_{ldpc}-K_{ldpc})/M-1$, row-block i of column-block $(K_{ldpc}/M+i)$ is formed of a unit matrix $I_{M\times M}$ (e.g., 432, 435 in FIG. 4C). Further, when $0 \le i \le (N_{ldpc}-K_{ldpc})/M-2$, row-block (i+1) of column-block $(K_{ldpc}/M+i)$ is formed of a unit matrix $I_{M\times M}$ (e.g., 434 in FIG. 4C).

Third, the blocks of the information word sub-matrix (e.g., 431 in FIG. 4C) may have a form $P^{a_{ij}}$ in which a circulant permutation matrix P is cyclic shifted, or a form in which the matrix $P^{a_{ij}}$ which is a form of a cyclic shifted circulant permutation matrix P is overlaid (or superposed). Meanwhile, the circulant permutation matrix has been explained above with reference to Mathematical Formula 6.

That is, the circulant permutation matrix P is a square matrix of M×M size, and the circulant permutation matrix P is a matrix in which degrees of the M columns and rows constituting the circulant permutation matrix P are 1, respectively.

A circulant permutation matrix P with the superscript $a_{ij}$ as 0, that is, the circulant permutation matrix $P^0$ represents a unit matrix $I_{M\times M}$, while a circulant permutation matrix P with superscript $a_{ij}$ as ∞, that is, the circulant permutation matrix $P^\infty$ represents a zero matrix.

Accordingly, by the row and column permutations, the total number of columns of the parity check matrix are $N_{ldpc}=M\times N_{qc\_column}$, and the total number of rows are $N_{parity}=M\times N_{qc\_row}$. Further, the parity check matrix may be formed of $N_{qc\_column}$ column blocks and $N_{qc\_row}$ row blocks, in which the respective blocks may be a quasi-cyclic structure matrix that corresponds to the M×M quasi-cyclic matrix.

As explained above, after the row and column permutations are performed, the permuted parity check matrix is divided into a predetermined number of groups according to a modulation mode.

To be specific, a parity check matrix is divided into a plurality of groups after the row and column permutations so that the number of groups can be an integer multiple of the number of bits constituting a modulation symbol. That is, when the number of bits constituting the modulation symbol is $N_b$, the number of groups may be a multiple of $N_b$. For example, when a modulation mode is 16-QAM, the number of bits constituting one modulation symbol are 4, in which case the parity check matrix may be divided into a number of groups as a multiple of 4, i.e., into 4 groups, 8 groups, and so on. In one example, matrices included in the respective groups may be formed of the same number of rows and columns.

The parity check matrix which is row and column permuted may be changed by shifting elements of at least one of a plurality of sub-groups formed of columns corresponding to the information word bits in at least one of a predetermined number of groups so that a sum of elements in same positions in the respective groups is less than 2.

Here, the shifting performed on the elements of at least one sub-group may be circular shifting, according to an exemplary embodiment. In addition, the shifting may be performed on the elements of each of the groups, instead of only a portion of the groups, so that the sum of elements in the same positions in the respective groups is less than 2, according to an exemplary embodiment.

In one example, elements of sub-groups each of which is formed of columns corresponding to the parity bits may not be shifted, while only elements of at least one sub-group formed of columns corresponding to the information word bits may be shifted, so that a sum of elements in same positions of the plurality of groups is less than 2.

That is, in dividing a parity check matrix into a plurality of groups of which the number corresponds to an integer multiple of the number of bits constituting a modulation symbol, one group may include columns corresponding to the information word bits and columns corresponding to the parity bits depending on a situation. In this case, shift can be performed only on elements of at least one sub-group formed of columns corresponding to the information word bits, while shift is skipped for columns corresponding to the parity bits.

Herebelow, a method for performing element shift on at least one sub-group formed of columns corresponding to the information word bits will be explained with reference to detailed examples.

For example, referring to FIG. 4D, the modulation mode is 16-QAM, and the parity check matrix 400 is divided into 4 groups (441 to 444).

In this example, the parity check matrix is formed of 80 columns, and thus, each of the respective groups (441 to 444) includes 20 columns. That is, the respective groups (441 to 444) may have a matrix of a same size, i.e., 20×20 square matrix. Further, because M=10, the sub-group 431 is 10×10 square matrix. Accordingly, each group includes 4 10×10 sub-groups.

In this example, the elements of at least one of the sub-groups formed of columns corresponding to the information word bits is shifted until a sum of elements in same positions in the plurality of groups (441 to 444) satisfies the constraint of being less than 2.

For example, in reference to FIG. 4D, until the sum of the elements in the same positions of the plurality of groups (441 to 444) satisfies the constraint of being less than 2, elements of at least one of the sub-groups including the sub-group 431 formed of columns corresponding to the information word bits may be shifted.

For a specific example, the elements of at least one of the sub-groups may be shifted so that a sum of elements in row 0 and column 0 of each group is less than 2, a sum of elements in row 0 and column 1 of each group is less than 2, . . . , a sum of elements in row 19 and column 18 of each group is less than 2, and a sum of elements in row 19 and column 19 of each group is less than 2.

Figure 4E:
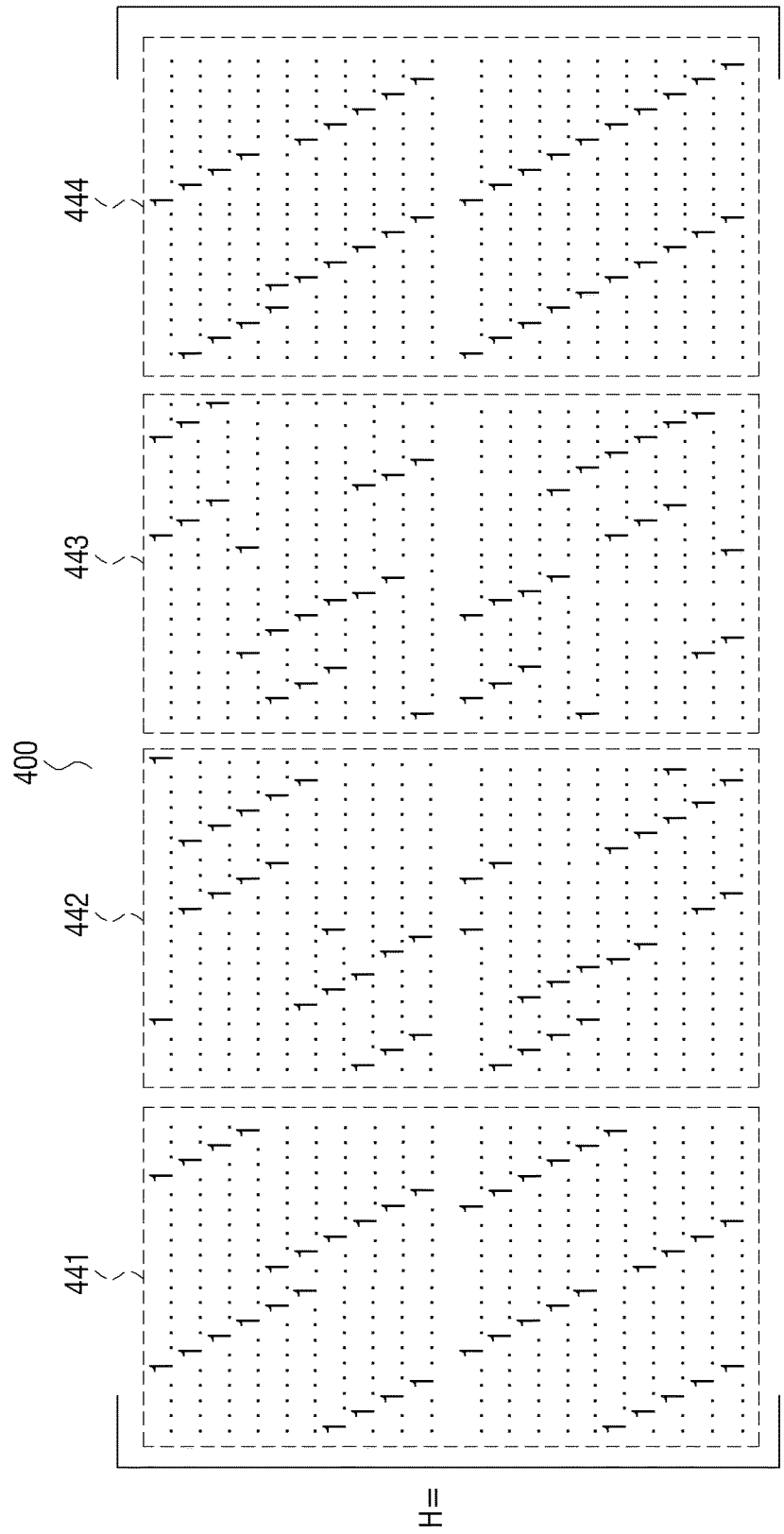

Accordingly, an example of a parity check matrix finally generated is illustrated in FIG. 4E. That is, referring to FIG. 4E, a sum of elements in same positions in the plurality of groups (441 to 444) is less than 2.

As a result, it is possible to generate a parity check matrix in which a sum of elements in same positions in the plurality of groups in the parity check matrix is less than 2.

As explained in the above embodiment, after performing row and column permutation on a preset parity check matrix, the permuted parity check matrix may be divided into a predetermined number of groups to change the parity check matrix such that a sum of elements in same positions in a plurality of groups constituting the parity check matrix is less than 2, but the inventive concept is not limited thereto.

When a preset parity check matrix has a quasi-cyclic structure, that is, when a preset parity check matrix with the structure as illustrated in FIG. 3 becomes a parity check matrix with a quasi-cyclic structure after row permutation and column permutation as illustrated in FIG. 4C, the preset parity check matrix may be generated without performing the row permutation and column permutation, by dividing the preset parity check matrix into a predetermined number of groups and shifting elements of at least one of sub-groups formed of columns corresponding to the information word bits in at least one group so that a sum of elements in same positions of the groups is less than 2.

In the above, a method of shifting elements of at least one of sub-groups formed of columns corresponding to the information word bits so that a sum of elements in same positions in the plurality of groups is less than 2 has been explained.

When an LDPC codeword is generated using a parity check matrix generated by the method explained above, LDPC codeword bits corresponding to different parity check equations may be mapped to one modulation symbol for reasons which will be explained in detail below.

First, a parity check matrix is divided into a plurality of groups based on the number of bits constituting one modulation symbol, because depending on the number of bits constituting one modulation symbol, the number of columns to be used at the interleaver 120 during interleaving is determined, and also because the bits output from a same row of a plurality of columns of the interleaver 120 constitute one modulation symbol.

Accordingly, by dividing a parity check matrix into a plurality of groups based on the number of bits constituting one modulation symbol, LDPC codeword bits corresponding to each group are written on a same column of the interleaver 120, and LDPC codeword bits corresponding to columns in same positions in the groups are written on a same row of the columns of the interleaver 120. For example, FIG. 4E exemplifies a case in which LDPC codeword bits corresponding to column 0 of group 441 are written on a first row of the first column of the interleaver 120, and LDPC codeword bits corresponding to column 0 of group 442 are written on the first row of the second column of the interleaver 120.

As described earlier, LDPC codeword bits output from a same row of the plurality of columns of the interleaver 120 are mapped to a same modulation symbol. Accordingly, in order for the LDPC codeword bits mapped to one modulation symbol to correspond to different parity check equations, bits written on a same row of each of the plurality of columns have to correspond to different parity check equations.

Bits written on a same row become LDPC codeword bits corresponding to columns in same positions in the plurality of groups of the parity check matrix. Further, one parity check equation is formed of LDPC codeword bits corresponding to columns where 1 exists in one row of the parity check matrix.

Accordingly, when a sum of elements in same positions in a plurality of groups in the parity check matrix is less than 2, only one of these elements separated at same predetermined intervals in each row of the parity check matrix has value 1. Accordingly, the LDPC codeword bits corresponding to columns in the same positions of the plurality of groups of the parity check matrix, that is, the bits written on the same row of the interleaver 120 correspond to different parity check equations.

As a result, by generating an LDPC codeword using the parity check matrix in which the sum of elements in the same positions in the plurality of groups is less than 2, it is possible to construct one modulation symbol with the LDPC codeword bits that correspond to different parity check equations.

Meanwhile, as explained above, an example of a preset parity check matrix and an example of a parity check matrix, generated by using the preset parity check matrix, so that a sum of elements in same positions in a plurality of groups of the generated parity check matrix is less than 2 may be represented by Tables 2 and 3, respectively as below. In one example, a code rate may be 4/9, an LDPC codeword length $N_{ldpc}$ is 16200, a length of an information word $K_{ldpc}$ is 7200, M is 360, and $Q_{ldpc}$ is 25.

TABLE 2

| i | index of row where 1 is located in the 0th column of the ith column group |
|---|---|
| 0 | 20 712 2386 6354 4061 1062 5045 5158 |
| 1 | 21 2543 5748 4822 2348 3089 6328 5876 |
| 2 | 22 926 5701 269 3693 2438 3190 3507 |
| 3 | 23 2802 4520 3577 5324 1091 4667 4449 |
| 4 | 24 5140 2003 1263 4742 6497 1185 6202 |
| 5 | 0 4046 6934 |
| 6 | 1 2855 66 |
| 7 | 2 6694 212 |
| 8 | 3 3439 1158 |
| 9 | 4 3850 4422 |
| 10 | 5 5924 290 |
| 11 | 6 1467 4049 |
| 12 | 7 7820 2242 |
| 13 | 8 4606 3080 |
| 14 | 9 4633 7877 |
| 15 | 10 3884 6868 |
| 16 | 11 8935 4996 |
| 17 | 12 3028 764 |
| 18 | 13 5988 1057 |
| 19 | 14 7411 3450 |

TABLE 3

| i | index of row where 1 is located in the 0th column of the ith column group |
|---|---|
| 0 | 20 712 2386 6354 4061 1062 5045 5158 |
| 1 | 21 2543 5748 4822 2348 3089 6328 5678 |
| 2 | 22 926 5701 269 3693 2438 3190 3507 |
| 3 | 48 1116 2827 3602 4474 4545 4692 5349 |
| 4 | 24 5140 2003 1263 4742 6497 1185 6202 |
| 5 | 25 4071 6959 |
| 6 | 26 91 2880 |
| 7 | 27 237 6719 |
| 8 | 28 1183 3464 |
| 9 | 29 3875 4447 |
| 10 | 30 315 5949 |
| 11 | 31 1492 4074 |
| 12 | 32 2267 7845 |
| 13 | 33 3105 4631 |
| 14 | 34 4658 7902 |
| 15 | 35 3909 6893 |
| 16 | 36 5021 8960 |
| 17 | 37 789 3053 |
| 18 | 38 1082 6013 |
| 19 | 39 3475 7436 |

To be specific, the information word sub-matrix of the parity check matrix formed of a plurality of column groups each including M columns, and in the plurality of column groups, position of 1 in each column 0 may be defined as Tables 2 and 3. That is, Tables 2 and 3 indicate an index of a row where 1 is positioned, in column 0 of column group i of the information word sub-matrix. In one example, the parity sub-matrix may have a dual diagonal structure.

That is, the information word sub-matrix is formed of 20 column groups each having 360 columns, and the position of 1 in column 0 of each column group may be defined by Tables 2 and 3.

For example, referring to Table 2, for column 0 of column group 0, rows 20, 712, 2386, . . . may have 1. Further, referring to Table 3, for column 0 of column group 0, rows 20, 712, 2386, . . . may have 1.

The rows having 1 in column 0 of each column group may then be cyclic shifted by $Q_{ldpc}$ to define positions of rows having 1 in different column of the column group.

For example, referring to Table 2, $Q_{ldpc}=25$, indexes of a row having 1 in column 0 of column group 0 is 20, 712, 2386, . . . . Thus, in column 1 of column group 0, indexes of a row having 1 may be 45 (=20+25), 737 (=712+25), 2411 (=2386+25), . . . , and in column 2 of column group 0, an index of a row having 1 may be 70 (=45+25), 762 (=737+25), 2436 (=2411+25), . . . .

Further, referring to Table 3, $Q_{ldpc}=25$, and indexes of a row having 1 in column 0 of column group 0 is 20, 712, 2386, . . . . Thus, in column 1 of column group 0, indexes of a row having 1 may also be 45 (=20+25), 737 (=712+25), 2411 (=2386+25), . . . , and in column 2 of column group 0, indexes of a row having 1 may also be 70 (=45+25), 762 (=737+25), 2436 (=2411+25), . . . .

As described earlier, Table 2 represents one example of a preset parity check matrix which used for generating a parity check matrix in which a sum of elements in same positions in a plurality of groups of the generated parity check matrix is less than 2.

Referring to the preset parity check matrix defined by Table 2, there is an instance in which a sum of elements in same positions of a plurality of groups of the preset parity check matrix can be greater than or equal to 2. However, even after applying row and column permutations to the preset parity check matrix defined by Table 2, and dividing the row and column permuted parity check matrix into 12 groups each of which is formed of 1350 columns, there is an instance in which a sum of elements in same positions of the plurality of groups are greater than or equal to 2.

Table 3 shows an example of a parity check matrix generated based on the preset parity check matrix defined by Table 2. This parity check matrix defined by Table 3 does not have an instance in which a sum of elements in same positions of a plurality of groups greater than or equal to 2.

Meanwhile, the parity check matrix of Table 3 may be generated based on a method explained below, according to an exemplary embodiment.

To be specific, after applying row and column permutations to the preset parity check matrix defined by Table 2 and dividing the row and column permuted parity check matrix into a plurality of groups, elements in at least one sub-group constituting the information word sub-matrix of the row and column permuted parity check matrix in at least one of the plurality of groups are shifted so that a sum of elements in same positions in the plurality of groups is less than 2.

Then, by applying reverse row and the column permutations to the parity check matrix generated by the element shifting, that is, by row and column de-permutation, a parity check matrix having an information word sub-matrix as defined by Table 3 may be obtained. Considering that a parity check matrix is de-permuted based on the same rules applied during permutation, a parity sub-matrix of the de-permuted parity check matrix may have a dual diagonal structure, as illustrated in FIG. 3.

Meanwhile, the parity check matrix defined by Table 3 has characteristics that a sum of elements in same positions in a plurality of groups which is less than 2. That is, after applying row and column permutations to the preset parity check matrix defined by Table 2 and dividing the row and column permuted parity check matrix into 12 groups, each group may be formed of 1350 columns. In this case, there is no instance that a sum of elements in same positions of the plurality of groups greater than or equal to 2.

Tables 2 and 3 represent a parity check matrix which is divided into 12 groups. Accordingly, the modulation mode may be one of QPSK, 16-QAM, 64-QAM and 4096-QAM.

Index sequences shown in Table 3 may be obtained by shifting all index sequences in Table 2 except sequences of column groups 0, 1, 2 and 4.

For example, a difference between corresponding sequences of column group 5 (0 4046 6934) of Table 2 and column group 5 (25,4071,6959) of Table 3 is: 25−0=4071−4046=6959−6934=25=$Q_{ldpc}$. Further, differences between a sequence of column group 7 (2,6694,212) of Table 2 and a sequence of column group 7 (27,237,6719) of Table 3 is: 27−2=237−212=6719−6694=25=$Q_{ldpc}$. Accordingly, since shifting is considered to have been done when a difference between sequences of corresponding column groups is an integer multiple of $Q_{ldpc}$, it is apparent that the sequences in Table 3 are obtained by proper shifting of the sequences in Table 2 except for the sequences of column groups 0, 1, 2 and 4.

Meanwhile, even when an order of a sequence of a column group i is changed in the parity check matrix of Table 2 or 3, the changed parity check matrix may be viewed as the same as or equivalent to the parity check matrix prior to such change.

For example, even when a sequence ordered 20, 712, 1062, 2386, 4061, 5045, 5158 in column 0 of column group 0 is changed to a sequence 712, 20, 1062, 4061, 2386, 5045, 5158 in Table 3, the changed parity check matrix is the same as or equivalent to the parity check matrix before the sequence therein is changed.

Further, even when the sequences themselves corresponding to the respective column groups are changed one another in Tables 2 and 3, cyclic characteristics on a code graph and/or algebraic characteristics of a corresponding LDPC code such as degree distribution, minimum distance, etc. are not changed. Thus, a parity check matrix which is generated by changing the sequences in Tables 2 and 3 is also covered by the inventive concept.

For example, in Table 3, when sequence 20, 712, 1062, 2386, 4061, 5045, 5158 of column 0 of column group 0 and sequence 82, 2317, 7895 of column 0 column group 12 are changed each other so that the sequence of column 0 of column group 0 is set to 82, 2317, 7895, and the sequence of column 0 of column group 12 is set to 20, 712, 1062, 2386, 4061, 5045, 5158, there is no change in cyclic characteristics on a code graph, degree distribution and/or a minimum distance of a corresponding LDPC code. In fact, changing sequences corresponding to column groups in Tables 2 and 3 do not cause change in main algebraic characteristics because such change is equivalent to changing an order the column groups arranged in the parity check matrix.

Table 4 shows an example where the sequences in Table 3 are changed, and Table 4 is also an example of a parity check matrix generated according to the inventive concept.

TABLE 4

| | index of row where 1 is located in the 0th column of the ith column group |
|---|---|
| 0 | 21 2543 5748 4822 2348 3089 6328 5876 |
| 1 | 22 926 5701 269 3693 2438 3190 3507 |
| 2 | 24 5140 2003 1263 4742 6497 1185 6202 |
| 3 | 20 712 2386 6354 4061 1062 5045 5158 |
| 4 | 23 2802 4520 3577 5324 1091 4667 4449 |
| 5 | 6 1467 4049 |
| 6 | 0 4046 6934 |
| 7 | 5 5924 290 |
| 8 | 8 4606 3080 |
| 9 | 1 2855 66 |
| 10 | 10 3884 6868 |
| 11 | 11 8935 4996 |
| 12 | 4 3850 4422 |
| 13 | 13 5988 1057 |
| 14 | 7 7820 2242 |
| 15 | 14 7411 3450 |
| 16 | 3 3439 1158 |
| 17 | 2 6694 212 |
| 18 | 9 4633 7877 |
| 19 | 12 3028 764 |

Further, because a parity check matrix generated by adding an integer multiple of $Q_{ldpc}$ to all elements of a sequence corresponding to any column group in Tables 2 and 3 may also have same cyclic characteristics on the code graph and/or algebraic characteristic such as degree distribution Thus, this parity check matrix is also covered by the present inventive concept.

For example, in the case of 82 (=32+2×*25), 2317 (=2267+2×25), 7895 (=7845+2×25), which is obtained by adding an integer multiple of 25 (=$Q_{ldpc}$=($N_{ldpc}$−$K_{ldpc}$)/M) to sequence 32, 2267, 7845 corresponding to column 0 of column group 12 in Table 3, cyclic characteristics on the code graph and/or algebraic characteristics such as degree distribution, and minimum distance do not change. In fact, the algebraic characteristics remain unchanged because a sequence obtained as a result of adding an integer multiple $Q_{ldpc}$ to all elements of the sequence is equivalent to re-arranging only an order of columns in a corresponding column group.

It should be noted that when an element of a sequence obtained by adding an integer multiple $Q_{ldpc}$ is ($N_{ldpc}$−$K_{ldpc}$) or greater, the element is changed by applying a modulo operation with respect to ($N_{ldpc}$−$K_{ldpc}$). For example, when 25×80 is added to sequence 32,2267,7845 corresponding to column 0 of column group 12 in Table 3 to generate 2032, 4267, 9845, modulo-9000 on the sequence (because ($N_{ldpc}$−$K_{ldpc}$)=9000) generates a sequence 845, 2032, 4267.

Further, although the sequences shown in Tables 2 and 3 are generated based on the parity check matrix as illustrated in FIG. 3, these sequences may represent a parity check matrix in a different form if row permutation that re-arranges an order of rows or column permutation that re-arranges an order of columns is applied. However, the parity check matrices before and after such row and/or column permutations are still considered to be the same or equivalent to each other because row exchange and/or column exchange do not cause any change in the cyclic characteristic and/or algebraic characteristics such as degree distribution, or minimum distance of an LDPC code.

That is, any given parity check matrix may be changed by row and column permutation into a parity check matrix as illustrated in FIG. 3, and when the changed parity check matrix has sequences that match the sequences in Table 2 or 3, the two parity check matrices are algebraically equivalent.

Herebelow, reasons why LDPC codeword bits corresponding to different parity check equations can constitute one modulation symbol will be explained.

Figure 5:
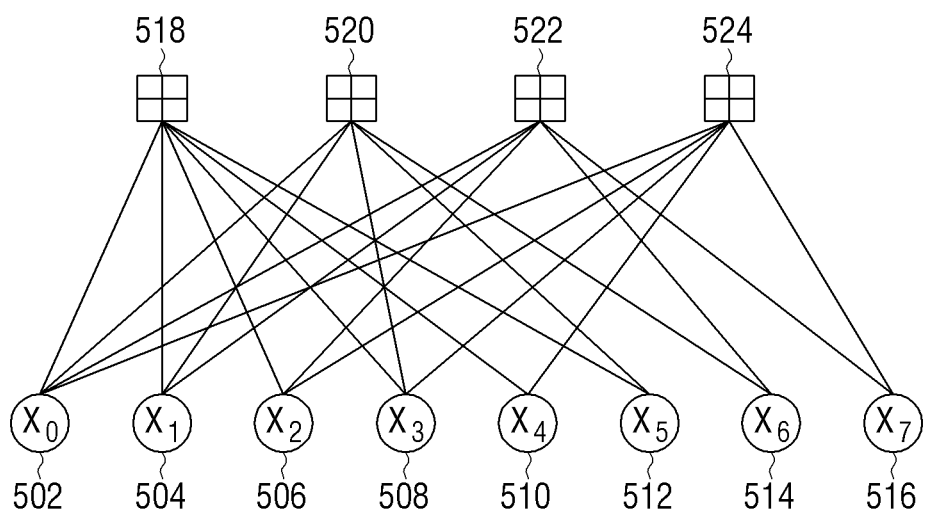
FIGS. 5 and 6 are diagrams provided to explain LDPC decoding according to exemplary embodiments.

FIG. 5 is a diagram provided to explain a method for representing a graph of an LDPC code. To be specific, FIG. 5 shows the parity check matrix H illustrated in FIG. 2 in a tanner graph.

Referring to FIG. 5, the tanner graph consists of 8 variable nodes, that is, $x_0$ (502), $x_1$ (504), $x_2$ (506), $x_3$ (508), $x_4$ (510), $x_5$ (512), $x_6$ (514), $x_7$ (516) and 4 check nodes (518, 520, 522, 528). In the parity check matrix H, column i (i=0, 1, . . . , 6, 7) and row j (j=0, 1, 2, 3) respectively correspond to variable node $x_i$ and check node j. Further, the value 1 at an intersection of column i and row j of the parity check matrix H, that is, the value other than 0 means that there exists an edge that connects variable node $x_i$ and check node j on the tanner graph, as illustrated in FIG. 5.

For example, the check node 518 corresponding to row 0 of the parity check matrix H is connected to respective variable nodes $x_0$ (502), $x_1$ (504), $x_2$ (506), $x_3$ (508), $x_4$ (510), x (512) which are at points having 1 in column 0.

Meanwhile, a parity check equation may be represented by variable nodes connected to one check node. That is, as explained above, considering that the check nodes are connected to the variable nodes at points having 1 in the parity check matrix, it is possible to represent a parity check equation corresponding to the check node by a binary operation of variable nodes connected to the corresponding check node (herein, values of the variable nodes are LDPC codeword bits). For example, a parity check equation corresponding to the check node 518 (i.e., a parity check equation corresponding to row 0 of the parity check matrix H) may be expressed as $x_0+x_1+x_2+x_3+x_4+x_5=0$.

Accordingly, from the viewpoint of the tanner graph, that LDPC codeword bits corresponding to different parity check equations form one modulation symbol could be interpreted as that, among variable nodes corresponding to value 1 existing in the parity check matrix, the LDPC codeword bits corresponding to the variable nodes that are not connected to a same check node form one modulation symbol.

Accordingly, when the LDPC codeword bits corresponding to variable nodes that are not connected to a same check node form one modulation symbol, LDPC decoding can have enhanced decoding efficiency, as will be explained in further detail below with reference to FIG. 6.

Figure 6:
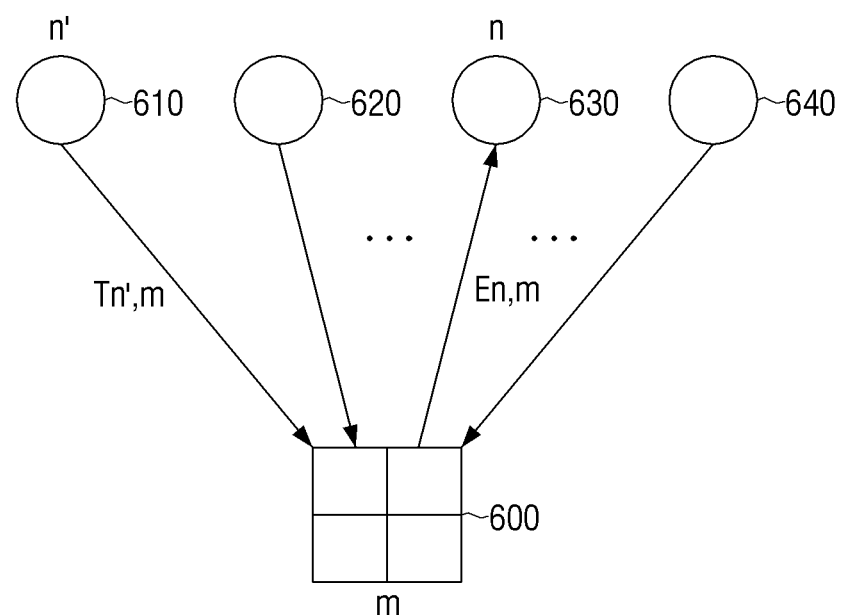
Figure 6:
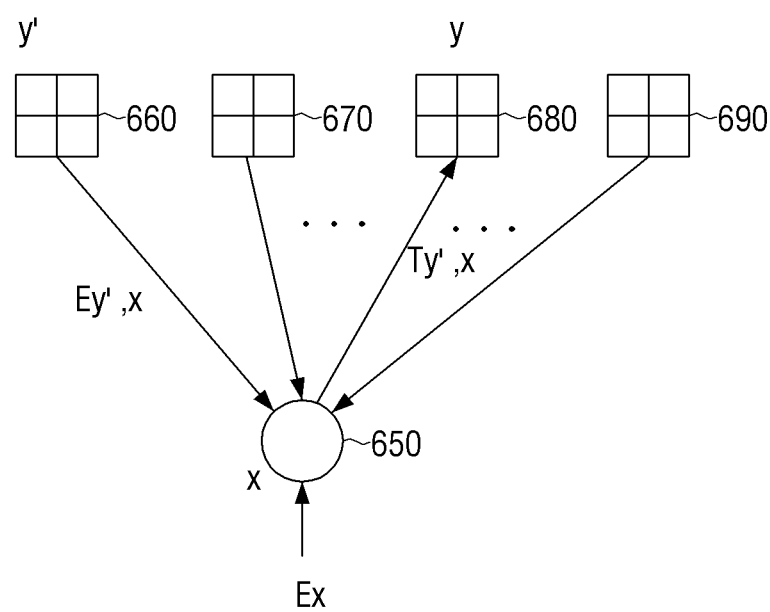

FIG. 6 is a diagram provided to explain a method of performing LDPC decoding. Referring to FIG. 6, LDPC decoding may be performed by a message passing operation at any check node and any variable node.

An LDPC code may be decoded using an iterative decoding algorithm based on a sum-product algorithm on a bipartite graph (i.e., the tanner graph) shown in FIG. 5. The sum-product algorithm is one of message passing algorithms which refer to algorithms which exchange messages through edges on the bipartite graph generated based on a parity check matrix, and calculates output messages from the messages input to the variable nodes or the check nodes and updates the same.

Considering that iterative decoding based on the sum-product algorithm is generally used in the LDPC decoding, a method for performing LDPC decoding according to iterative decoding of the sum-product algorithm will be briefly explained below.

Referring to FIG. 6, check node m (600) and a plurality of variable nodes (610, 620, 630, 640) connected to the check node m (600) are illustrated. In the illustration, $T_{n',m}$ represents a message passed from variable node n' (610) to check node m (600), and $E_{n,m}$ represents a message passed from check node m (600) to variable node n (630). It is defined herein that a set of all variable nodes connected to the check node m (600) is N(m), and a set of N(m) except variable node n (630) is N(m) \ n. In one example, a message update rule based on the sum-product algorithm may be represented by Mathematical Formula 9 as below.

$$|E_{n,m}| = \Phi\left[\sum_{n' \in N(m)\backslash n} \Phi(|T_{n'm}|)\right] \quad \text{[Mathematical Formula 9]}$$

$$\text{Sign}(E_{n,m}) = \prod_{n' \in N(m)\backslash n} \text{sign}(T_{n'm}),$$

where $\text{Sign}(E_{n,m})$ denotes a sign of message $E_{n,m}$, and $|E_{n,m}|$ is a magnitude of message $E_{n,m}$. Meanwhile, function $\Phi(x)$ may be represented by Mathematical Formula 10 as below.

$$\Phi(x) = -\log\left(\tanh\left(\frac{x}{2}\right)\right) \quad \text{[Mathematical Formula 10]}$$

FIG. 6 illustrates variable node x (650) and a plurality of check nodes (660, 670, 680, 690) connected to variable node x (650). In the illustration, $E_{y',x}$ denotes a message passed from check node y' (660) to variable node x (650), and $T_{y,x}$ denotes a message passed from variable node x (650) to variable node y (680). It is defined herein that a set of all variable nodes connected to variable node x (650) is M(x), and that a set of M(x) excluding check node y (680) is M(x) \ y. In one example, a message update rule based on the sum-product algorithm may be represented by Mathematical Formula 11 as below.

$$T_{y,x} = E_x + \sum_{y' \in M(x)\backslash y} E_{y',x}, \quad \text{[Mathematical Formula 11]}$$

where $E_x$ denotes an initial message value of variable node x.

Accordingly, during LDPC decoding, any check node decodes LDPC codeword bits by passing messages with variable nodes connected therewith.

Meanwhile, when LDPC codeword bits corresponding to variable nodes connected to a check node have error on a channel due to noise or the like, it is necessary to perform an increased number of repeated message passing operation during LDPC decoding for error correction.

When LDPC codeword bits corresponding to variable nodes connected to one check node are transmitted as different modulation symbols rather than one modulation symbol, a possibility that the entire LDPC codeword bits would have error decreases.

Meanwhile, variable nodes connected to one check node constitute one parity check equation. Accordingly, that LDPC codeword bits corresponding to variable nodes connected to one check node are transmitted as different modulation symbols indicates that the LDPC codeword bits included in one parity check equation are transmitted as different modulation symbols, which in turn indicates that one modulation symbol is formed of LDPC codeword bits included in different parity check equations.

As a result, by constructing one modulation symbol with LDPC codeword bits included in different parity check equations, it is possible to enhance decoding time and efficiency during LDPC decoding.

Accordingly, it is possible to generate an LDPC codeword using a parity check matrix generated according to the above exemplary embodiment and accordingly, it is possible to map the LDPC codeword bits included in different parity check equations to one modulation symbol.

According to an exemplary embodiment, the interleaver 120 does not need to perform a separate column twist operation. The column twist operation twists a position of a bit which is initially written in each column during interleaving, as defined by the standards including DVB-T2.

That is, in the related art standard such as DVB-T2, the column twist operation is used. However, according to an exemplary embodiment, as the LDPC codeword is generated using a parity check matrix having specific structure, it is possible to map the LDPC codeword bits included in different parity check equations to one modulation symbol, without requiring a separate column twist operation.

Figure 7:
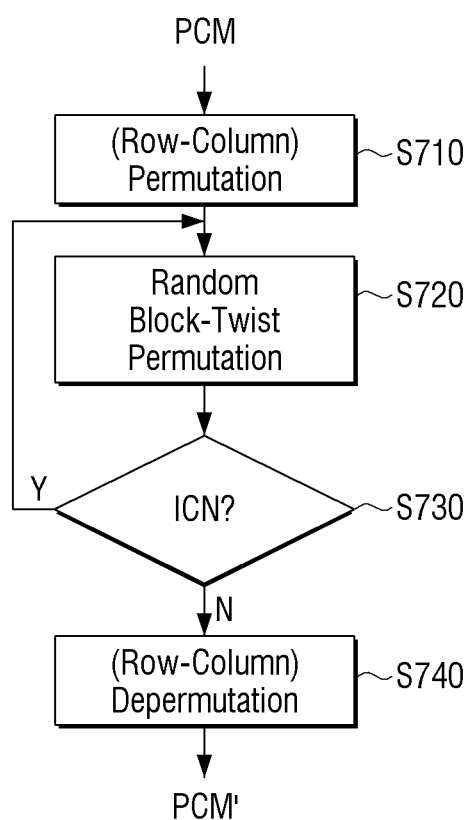
FIG. 7 is a flowchart provided to explain a parity check matrix generating method according to an exemplary embodiment.

Meanwhile, FIG. 7 is a flowchart provided to explain a method of generating a parity check matrix according to an exemplary embodiment.

First, row and column permutations are performed on a parity check matrix PCM, at S710. For example, the parity check matrix PCM may have a structure of Table 2.

In one example, the row permutation is performed according to a predetermined interleaving rule (e.g., Mathematical Formula 5) until each of a plurality of sub-groups constituting an information word sub-matrix has a circulant permutation matrix structure or a circulant permutation matrix superposition structure, and the column permutation is performed according to a predetermined interleaving rule (e.g., Mathematical Formula 7) on the parity sub-matrix only.

After that, elements in at least one sub-group constituting the information word sub-matrix is shifted randomly, at S720, and it is checked whether an ineffective check node (ICN) is generated, at S730. Checking an ICN may be performed by checking whether a sum of elements in same positions in a plurality of groups is less than 2. To be more specific, checking an ICN may be performed by checking whether the sum of the elements in same positions in the plurality of groups of the row and column permuted parity check matrix is less than 2.

If it is determined that an ICN is generated, at S730—Y, at least one sub-group constituting the information word sub-matrix is shifted again, at S720, and it is checked whether an ICN is generated, at S730. That is, the shift is performed until a sum of elements in same positions of the plurality of groups of the row and column permuted parity check matrix is less than 2.

Accordingly, if it is determined that no ICN is generated, at S730—N, row and column permutations are performed reversely on the parity check matrix generated by the shift, at S740. That is, by performing de-permutation in reverse to the row and column permutation performed at S710, a parity check matrix PCM' having the structure as Table 3 is generated.

Meanwhile, the transmitting apparatus 100 (FIG. 1) may store in advance a parity check matrix having the structure of Table 3. Note that the transmitting apparatus 100 may store a preset parity check matrix used for generating the parity check matrix having the structure of Table 3, and the encoder 110 may generate the parity check matrix having the structure of Table 3 using the preset parity check matrix.

Figure 8:
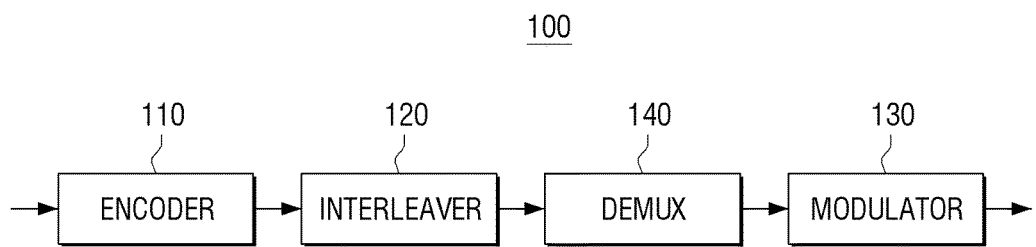
FIG. 8 is a block diagram provided to explain a detailed structure of a transmitting apparatus according to an exemplary embodiment.

FIG. 8 is a block diagram provided to explain detailed structure of a transmitting apparatus according to an exemplary embodiment. Referring to FIG. 8, the transmitting apparatus 100 includes the encoder 110, the interleaver 120 and the modulator 130 as illustrated in FIG. 1, and additionally includes a demux 140. As the encoder 110, the interleaver 120 and the modulator 130 are identical to those explained above with reference to FIG. 1, these will not be redundantly explained below for the sake of brevity.

The demux 140 (or, demultiplexer) demultiplexes bits output from the interleaver 120. To be specific, the demux 140 may demultiplex the bits output from the interleaver 120 by performing bit-to-cell conversion into cells (or parallel data cells) having a certain number of bits, and output these to the modulator 130.

Figure 9:
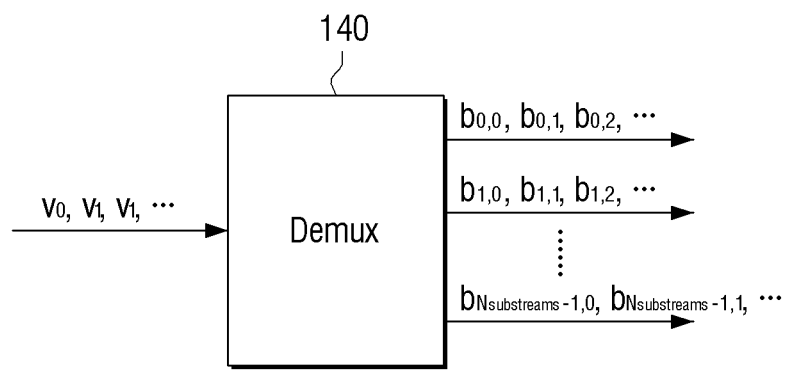
FIG. 9 is a diagram provided to explain a demux according to an exemplary embodiment.

For example, as illustrated in FIG. 9, the demux 140 may receive an interleaved LDPC codeword $V=[v_0, v_1, v_2, \ldots]$, and output bits of the LDPC codeword sequentially to one of a plurality of sub-streams. The number of sub-streams may be equal to the number of bits constituting one modulation symbol. Accordingly, the number of sub-streams may vary depending on modulation modes.

To be specific, among the received LDPC codeword bits, the demux 140 outputs $N_{substreams}$ bits as 1 to N sub-streams, and outputs next $N_{substreams}$ bits as 1 to N sub-streams in continuation.

In one example, the demux 140 may determine sub-streams for outputting bits in accordance with a predetermined rule. For example, when the modulation mode is 16-QAM and $N_{substreams}=4$, the demux 140 may output bits sequentially, by outputting bits whose index i satisfies i mod 4=1 as sub-stream 4, outputting bits whose index i satisfies i mod 4=2 as sub-stream 1, outputting bits whose index i satisfies i mod 4=3 as sub-stream 2, and outputting bits whose index i satisfies i mod 4=0 as sub-stream 3, but not limited thereto. Accordingly, the sub-streams generated by demuxing bits received at the demux 140 may be determined based on various rules.

The modulator 130 may modulate cells output from the demux 140. In one example, a cell is formed of bits of same indexes in the sub-streams, and the modulator 130 may map the cell to constellation.

For example, when the modulation mode is 16-QAM, the modulator 130 may sequentially map cells $(b_{0,0}, b_{1,0}, b_{2,0}, b_{3,0}), (b_{0,1}, b_{1,1}, b_{2,1}, b_{3,1}), \ldots$ output from demux 140 to the constellation.

Figure 10:
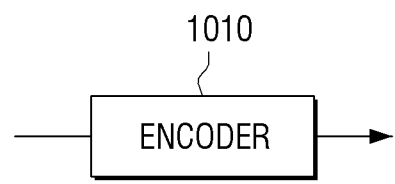
FIG. 10 is a block diagram provided to explain a structure of an encoding apparatus according to an exemplary embodiment.

FIG. 10 is a block diagram provided to explain an encoding apparatus according to an exemplary embodiment. As illustrated in FIG. 10, the encoding apparatus 1000 includes an encoder 1010. As the encoder 1010 performs identical functions as the encoder 110 illustrated in FIG. 1, description regarding FIG. 10 may apply equally to the encoder 110 in FIG. 1, or vice versa.

The encoder 1010 generates an LDPC codeword by performing LDPC encoding based on a parity check matrix.

In one example, the encoder 1010 may systematically perform the LDPC encoding, in which case the LDPC codeword may include an information word added by a parity.

For example, the encoder 1010 may generate an LDPC codeword $(i_0, i_1, i_2, \ldots, i_{K_{ldpc}-1}, p_0, p_1, p_2, \ldots, p_{N_{ldpc}-K_{ldpc}-1})$ by performing LDPC encoding on information word bits $(i_0, i_1, i_2, \ldots, i_{K_{ldpc}-1})$ formed of $K_{ldpc}$ bits. That is, encoder 1010 may generate an LDPC codeword by adding parity bits $(p_0, p_1, p_2, \ldots, p_{N_{ldpc}-K_{ldpc}-1})$ formed of $N_{ldpc}-K_{ldpc}$ bits to the information word bits.

The parity check matrix may be a parity check matrix in which a sum of elements in same positions in a plurality of groups constituting the parity check matrix is less than 2.

To be specific, the parity check matrix may be generated by performing row permutation and column permutation on a preset parity check matrix, dividing the permuted parity check matrix according to a modulation mode into a predetermined number of groups, and shifting at least one of sub-groups in at least one of the predetermined number of groups, so that a sum of elements in same positions of the groups is less than 2. Here, the shifting performed on the elements of at least one sub-group may be circular shifting, according to an exemplary embodiment. In addition, the shifting may be performed on the elements of each of the groups, instead of only a portion of the groups, so that the sum of elements in the same positions in the respective groups is less than 2, according to an exemplary embodiment.

At least one of the sub-groups may be a matrix of a circulant permutation matrix structure.

Further, the plurality of groups may be generated by dividing a parity check matrix into a predetermined number of groups according to a modulation mode, and each of the sub-groups may be a matrix with a size obtained by dividing a difference between a length of an LDPC codeword generated based on the parity check matrix and a length of an information word constituting the LDPC codeword by a predetermined constant.

Meanwhile, as explained above, row permutation and column permutation may be performed on the preset parity check matrix, but the inventive concept is not limited thereto. Accordingly, when the preset parity check matrix has a quasi-cyclic structure, it is possible to divide the preset parity check matrix into a predetermined number of groups according to a modulation mode without the row and column permutations, and shift elements in at least one of the sub-groups formed of columns corresponding to the information word bits in at least one of the groups included in the information word sub-matrix among the predetermined number of groups so that a sum of elements in same positions in the predetermined number of groups is less than 2.

Meanwhile, the detailed method for generating the above parity check matrix has been explained earlier and will not be redundantly explained below.

An example of a parity check matrix may be defined as Table 5. That is, an information word sub-matrix of the parity check matrix may be defined as Table 5, and a parity sub-matrix may have a dual diagonal structure.

In one example, the encoder 1010 may generate an LDPC codeword formed of 16200 bits by performing LDPC encoding according to a 4/9 code rate, where M=360, and $Q_{ldpc}$=25.

TABLE 5

| | index of row where 1 is located in the 0th column of the ith column group |
|---|---|
| 0 | 20 712 2386 6354 4061 1062 5045 5158 |
| 1 | 21 2543 5748 4822 2348 3089 6328 5876 |
| 2 | 22 926 5701 269 3693 2438 3190 3507 |
| 3 | 48 1116 2827 3602 4474 4545 4692 5349 |
| 4 | 24 5140 2003 1263 4742 6497 1185 6202 |
| 5 | 25 4071 6959 |
| 6 | 26 91 2880 |
| 7 | 27 237 6719 |
| 8 | 28 1183 3464 |
| 9 | 29 3875 4447 |
| 10 | 30 315 5949 |
| 11 | 31 1492 4074 |
| 12 | 32 2267 7845 |

TABLE 5-continued

| | index of row where 1 is located in the 0th column of the ith column group |
|---|---|
| 13 | 33 3105 4631 |
| 14 | 34 4658 7902 |
| 15 | 35 3909 6893 |
| 16 | 36 5021 8960 |
| 17 | 37 789 3053 |
| 18 | 38 1082 6013 |
| 19 | 39 3475 7436 |

Table 5 has the same structure as Table 3 and is generated with the same method. Accordingly, redundant explanation will be omitted for the sake of brevity.

The encoding apparatus 1000 may store in advance the parity check matrix defined by Table 5, but the inventive concept not limited thereto. Accordingly, the encoding apparatus 1000 may store a preset parity check matrix such as one illustrated in FIG. 3 used for generating the parity check matrix defined by Table 5. According to an exemplary embodiment, the encoder 1010 may store the preset parity check matrix and generate the parity check matrix defined by Table 5 using the stored preset parity check matrix and the method explained above.

The functions of the encoder 1010 to generate parity bits through LDPC encoding may be expressed by Mathematical Formula 12 as below. This is also identical to the manner defined in the standards including DVB-S2/T2/C2. Accordingly, redundant explanation thereof will be omitted for the sake of brevity.

$$p_i = p_i \oplus p_{i-1} \quad i=1,2, \ldots, N_{ldpc}-K_{ldpc}-1 \quad \text{[Mathematical Formula 12]}$$

where $p_i$ denotes $i^{th}$ parity bits, $N_{ldpc}$ is the length of the LDPC codewords, $K_{ldpc}$ is the length of the information word of the LDPC codewords, and $\oplus$ is binary operation. According to binary operation, $1\oplus1$ is 0, $1\oplus0$ is 1, $0\oplus1$ is 1, and $0\oplus0$ is 0.

Accordingly, the encoder 1010 may generate parity bits pi (i=0, 1, 2, . . . , $N_{ldpc}-K_{ldpc}-1$) based on a result of Mathematical Formula 12.

FIG. 11 is a block diagram provided to explain a structure of a receiving apparatus according to an exemplary embodiment. Referring to FIG. 11, the receiving apparatus 1100 includes a demodulator 1110, a deinterleaver 1120 and a decoder 1130.

The demodulator 1110 receives a signal from the transmitting apparatus 100 and demodulates the same. To be specific, the demodulator 1110 demodulates the received signal to generate a value corresponding to an LDPC codeword and output a result to the deinterleaver 1120.

In one example, the value corresponding to the LDPC codeword may be expressed as a channel value with respect to the received signal. Various methods may be implemented to determine the channel value. For example, one of the methods may include an operation of determining a Log Likelihood Ratio (LLR) value.

The LLR may be expressed as a logarithm of a ratio of likelihood that a bit transmitted from the transmitting apparatus 100 is 0 and likelihood that the bit is 1. Alternatively, the LLR value may itself be a value of a bit as determined by the hard decision, or the LLR value may be a representative value which is determined based on a section that includes a likelihood that a bit transmitted from the transmitting apparatus 100 is 0 or 1.

Meanwhile, regarding the received signal, LDPC codeword bits corresponding to different parity check equations may be mapped to one modulation symbol. As the method for mapping LDPC codeword bits corresponding to different parity check equations to one modulation symbol has been explained in detail above with reference to the transmitting apparatus 100, redundant explanation thereof will be omitted for the sake of brevity.

The deinterleaver 1120 deinterleaves an output value from the demodulator 1110 and outputs a result to the decoder 1130.

In one example, the deinterleaver 1120 is a component corresponding to the interleaver 120 of the transmitting apparatus 100, which may perform operations corresponding to the operations of the interleaver 120. To be specific, the deinterleaver 1120 may column deinterleave LLR values corresponding to the information word bits and the parity bits and deinterleave LLR values corresponding to the parity. In one example, the deinterleaver 1120 may perform deinterleaving by reversely applying the interleaving rules as applied during interleaving at the interleaver 120.

The decoder 1130 may perform decoding using an output value from the deinterleaver 1120. To this end, the decoder 1130 may include an LDPC decoder (not illustrated) for LDPC decoding.

To be specific, the deinterleaver 1120 may deinterleave LLR values corresponding to LDPC codeword bits and output a result to the decoder 1130, and the decoder 1130 may perform the LDPC decoding based on the deinterleaved LLR value.

For example, the decoder 1130 may perform the LDPC decoding using iterative decoding operations based on a sum-product algorithm. That is, the decoder 1130 may perform LDPC decoding by exchanging messages (e.g., LLR values) through the edges on the bipartite graph, and calculating output messages from the messages input from the variable nodes or the check nodes and update the same.

In one example, the parity check matrix used during LDPC decoding may be a parity check matrix in which a sum of elements in same positions of a plurality of groups of the parity check matrix is less than 2.

To be specific, the parity check matrix may be generated by performing row permutation and column permutations on a preset parity check matrix, dividing the permuted parity check matrix into a predetermined number of groups according to a modulation mode, and shifting at least one of sub-groups in at least one of the plurality of groups so that the sum of the elements in same positions of the plurality of groups is less than 2.

At least one of the sub-groups may be a matrix of a circulant permutation matrix structure.

The plurality of groups may be generated by dividing a parity check matrix into a predetermined number of groups according to a modulation mode, and each of the sub-groups may be a matrix with a size obtained by dividing a difference between a length of an LDPC codeword generated based on the parity check matrix and a length of an information word constituting the LDPC codeword by a predetermined constant.

As explained above, row permutation and column permutation may be performed on the preset parity check matrix, but the inventive concept is not limited thereto. Accordingly, when the preset parity check matrix has a quasi-cyclic structure, it is possible to divide the preset parity check matrix into a predetermined number of groups according to a modulation mode without the row and column permutations, and shift elements in at least one of the sub-groups formed of columns corresponding to the information word bits in at least one of the groups included in the information word sub-matrix among the predetermined number of groups so that a sum of elements in same positions in the predetermined number of groups is less than 2.

The detailed method for generating the above parity check matrix has been explained earlier and will not be redundantly explained below.

An example of a parity check matrix may be defined as Table 6. That is, an information word sub-matrix of the parity check matrix may be defined as Table 6, and a parity sub-matrix may have a dual diagonal structure.

TABLE 6

| | index of row where 1 is located in the 0th column of the ith column group |
|---|---|
| 0 | 20 712 2386 6354 4061 1062 5045 5158 |
| 1 | 21 2543 5748 4822 2348 3089 6328 5876 |
| 2 | 22 926 5701 269 3693 2438 3190 3507 |
| 3 | 48 1116 2827 3602 4474 4545 4692 5349 |
| 4 | 24 5140 2003 1263 4742 6497 1185 6202 |
| 5 | 25 4071 6959 |
| 6 | 26 91 2880 |
| 7 | 27 237 6719 |
| 8 | 28 1183 3464 |
| 9 | 29 3875 4447 |
| 10 | 30 315 5949 |
| 11 | 31 1492 4074 |
| 12 | 32 2267 7845 |
| 13 | 33 3105 4631 |
| 14 | 34 4658 7902 |
| 15 | 35 3909 6893 |
| 16 | 36 5021 8960 |
| 17 | 37 789 3053 |
| 18 | 38 1082 6013 |
| 19 | 39 3475 7436 |

Table 6 has the same structure as Table 3 and is generated with the same method. Accordingly, redundant explanation will be omitted for the sake of brevity.

The receiving apparatus 1100 may store in advance the parity check matrix as Table 6 or receive the same from the transmitting apparatus 100, although the inventive concept is not limited thereto. Accordingly, the receiving apparatus 1100 may store a preset parity check matrix such as one illustrated in FIG. 3 used for generating the parity check matrix defined by Table 6. According to an exemplary embodiment, the decoder 1130 may store the preset parity check matrix and generate the parity check matrix defined by Table 6 using the stored preset parity check matrix and the methods explained above.

Further, the receiving apparatus 1100 may additionally include a mux (or multiplexer) (not illustrated) configured to multiplex an output value from the demodulator 1110 and output a result to the deinterleaver 1120.

To be specific, the mux (not illustrated) is a component corresponding to the demux 140 of the transmitting apparatus 100, and may perform operations corresponding to the operations of the demux 140. That is, the mux 1120 may re-arrange LLR values in a bit unit by cell-to-bit converting output values from the demodulator 1110.

Figure 12:
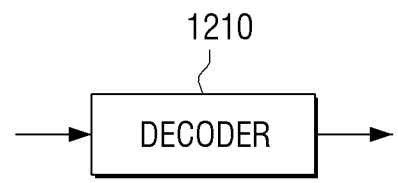
FIG. 12 is a block diagram provided to explain a structure of a decoding apparatus according to an exemplary embodiment.

FIG. 12 is a block diagram provided to explain a decoding apparatus according to an exemplary embodiment. Referring to FIG. 12, the decoding apparatus 1200 includes a decoder 1210. As the decoder 1210 in FIG. 12 has the same functions as the decoder 1130 in FIG. 11, redundant description about its operations or elements will not be provided for the sake of brevity.

The decoder 1210 performs LDPC decoding using a parity check matrix. In one example, the parity check matrix used during the LDPC decoding may be a parity check matrix in which a sum of elements in same positions of a plurality of groups is less than 2.

To be specific, the parity check matrix may be generated by performing row permutation and column permutations on a preset parity check matrix, dividing the permuted parity check matrix into a predetermined number of groups according to a modulation mode, and shifting at least one of sub-groups in at least one of the plurality of groups so that the sum of the elements in same positions of the plurality of groups is less than 2.

At least one of the sub-groups may be a matrix of a circulant permutation matrix structure.

The plurality of groups may be generated by dividing a parity check matrix into a predetermined number of groups according to a modulation mode, and each of the sub-groups may be a matrix with a size obtained by dividing a difference between a length of an LDPC codeword generated based on the parity check matrix and a length of an information word constituting the LDPC codeword by a predetermined constant.

As explained above, row permutation and column permutation may be performed on the preset parity check matrix, but the inventive concept is not limited thereto. Accordingly, when the preset parity check matrix has a quasi-cyclic structure, it is possible to divide the preset parity check matrix into a predetermined number of groups according to a modulation mode without the row and column permutations, and shift elements in at least one of the sub-groups formed of columns corresponding to the information word bits in at least one of the groups included in the information word sub-matrix among the predetermined number of groups so that a sum of elements in same positions in the predetermined number of groups is less than 2.

The detailed method for generating the above parity check matrix has been explained earlier and will not be redundantly explained below.

An example of a parity check matrix may be defined as Table 7. That is, an information word sub-matrix of the parity check matrix may be defined as Table 7, and a parity sub-matrix may have a dual diagonal structure.

TABLE 7

| | index of row where 1 is located in the 0th column of the ith column group |
|---|---|
| 0 | 20 712 2386 6354 4061 1062 5045 5158 |
| 1 | 21 2543 5748 4822 2348 3089 6328 5876 |
| 2 | 22 926 5701 269 3693 2438 3190 3507 |
| 3 | 48 1116 2827 3602 4474 4545 4692 5349 |
| 4 | 24 5140 2003 1263 4742 6497 1185 6202 |
| 5 | 25 4071 6959 |
| 6 | 26 91 2880 |
| 7 | 27 237 6719 |
| 8 | 28 1183 3464 |
| 9 | 29 3875 4447 |
| 10 | 30 315 5949 |
| 11 | 31 1492 4074 |
| 12 | 32 2267 7845 |
| 13 | 33 3105 4631 |
| 14 | 34 4658 7902 |
| 15 | 35 3909 6893 |

TABLE 7-continued

| | index of row where 1 is located in the 0th column of the ith column group |
|---|---|
| 16 | 36 5021 8960 |
| 17 | 37 789 3053 |
| 18 | 38 1082 6013 |
| 19 | 39 3475 7436 |

Table 7 has the same structure as Table 3 and is generated with the same method. Accordingly, redundant explanation will be omitted for the sake of brevity.

The decoding apparatus 1200 may store in advance the parity check matrix as Table 7, although the inventive concept is not limited thereto. Accordingly, the decoding apparatus 1200 may store a preset parity check matrix such as one illustrated in FIG. 3 used for generating the parity check matrix defined by Table 7. According to an exemplary embodiment, the decoder 1210 may store the preset parity check matrix and generate the parity check matrix defined by Table 7 using the stored preset parity check matrix and the methods explained above.

Figure 13:
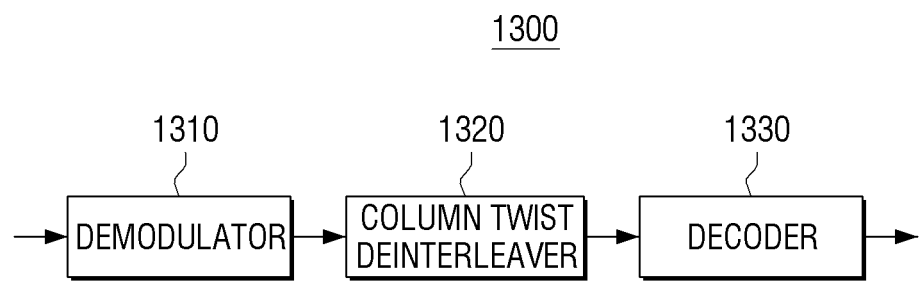
FIG. 13 is a block diagram provided to explain a structure of a receiving apparatus according to another embodiment.

FIG. 13 is a block diagram provided to explain a structure of a receiving apparatus according to another exemplary embodiment. Referring to FIG. 13, the receiving apparatus 1300 may include a demodulator 1310, a column twist interleaver 1320 and a decoder 1330.

Considering that the receiving apparatus 1300 of FIG. 13 receives a signal from the transmitting apparatus 1400 of FIG. 14 and processes the same, prior to explaining the receiving apparatus 1300, the transmitting apparatus 1400 will be explained first.

Figure 14:
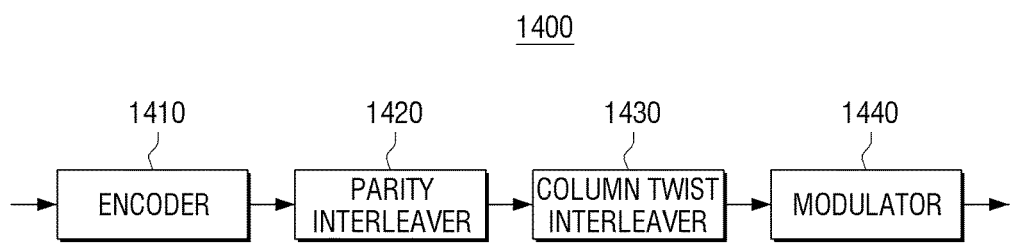
FIG. 14 is a block diagram of a related art transmitting apparatus.

Referring to FIG. 14, the transmitting apparatus 1400 includes an encoder 1410, a parity interleaver 1420, a column twist interleaver 1430 and a modulator 1440. FIG. 14 schematically illustrates a transmitting apparatus as defined by the standards including DVB-T2/C2/NGH for the transmitting apparatus 1400.

The encoder 1410 performs LDPC encoding on input bits which are information word bits. In one example, the encoder 1410 may generate an LDPC codeword by using a parity check matrix as defined by respective standards.

The parity interleaver 1420 performs interleaving on parity bits constituting the LDPC codeword.

The column twist interleaver 1430 may perform column interleaving on a parity interleaved LDPC codeword.

To be specific, the column twist interleaver 1430 may perform interleaving, using $N_c$ columns formed of $N_r$ rows. That is, the column twist interleaver 1430 may interleave by writing parity-interleaved LDPC codeword bits from column 1 to column $N_c$ in a column direction, and reading a plurality of columns written with the LDPC codeword bits from row 1 to row $N_r$ in a row direction.

In one example, the column twist interleaver 1430 may determine a position to initially write the LDPC codeword bits in the respective columns and write the LDPC codeword bits from the determined position.

For example, the DVB-T2 standard defines the twisting parameters, in which the positions to initially write the bits are defined as Table 8 below.

TABLE 8

| | | | | Twisting parameter $t_c$ | | | | | | | | | | | | | | |
|---|---|---|---|---|---|---|---|---|---|---|---|---|---|---|---|---|---|---|
| Modulation | Column $N_c$ | $N_{ldpc}$ | col 0 | 1 | 2 | 3 | 4 | 5 | 6 | 7 | 8 | 9 | 10 | 11 | 12 | 13 | 14 | 15 |
| 16-QAM | 8 | 64800 | 0 | 0 | 2 | 4 | 4 | 5 | 7 | 7 | — | — | — | — | — | — | — | — |
| | | 16200 | 0 | 0 | 0 | 1 | 7 | 20 | 20 | 21 | — | — | — | — | — | — | — | — |

TABLE 8-continued

| Modulation | Column $N_c$ | $N_{ldpc}$ | col 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|---|---|
| 64-QAM | 12 | 64800 | 0 | 0 | 2 | 2 | 3 | 4 | 4 | 5 | 5 | 7 | 8 | 9 | — | — | — | — |
|  |  | 16200 | 0 | 0 | 0 | 2 | 2 | 2 | 7 | 3 | 3 | 6 | 7 | 7 | — | — | — | — |
| 256-QAM | 16 | 64800 | 0 | 2 | 2 | 2 | 2 | 3 | 3 | 15 | 16 | 20 | 22 | 22 | 27 | 27 | 28 | 32 |
|  | 8 | 16200 | 0 | 0 | 0 | 0 | 1 | 7 | 20 | 21 | — | — | — | — | — | — | — | — |

The twisting parameter $t_c$ refers to a position of a row where bits are initially written in each column.

For example, when a length of an LDPC codeword $N_{ldpc}$ is 64800, and a modulation mode is 16-QAM, LDPC codeword bits are written from a first row (row 0) in a first column (col 0), from the first row (row 0) in a second column (col 1), from a third row (row 2) in a third column (col 2), from a fifth row (row 4) in a fourth column (col 3), from the fifth row (row 4) in a fifth column (col 4), and from a sixth row in a sixth column (col 5).

The modulator 1440 modulates an interleaved LDPC codeword. To be specific, the modulator 1440 may separate interleaved LDPC codeword bits output from the interleaver 1430 into a certain number of bits, and map these to interleaved symbols to transmit to the receiving apparatus 1300.

A receiving apparatus generally has to include components corresponding to the respective components of a transmitting apparatus, in order to receive signals from the transmitting apparatus and process the same. For example, when the transmitting apparatus 1400 having the structure as in FIG. 14 processes signals, the receiving apparatus will need to include a demodulator (not illustrated), a column twist deinterleaver (not illustrated), a parity deinterleaver (not illustrated) and a decoder (not illustrated) to correspond to the encoder 1410, the parity interleaver 1420, the column twist interleaver 1430 and the modulator 1440, thereby to perform the processing done at the transmitting apparatus 1400 in a reverse manner.

However, the receiving apparatus 1300 according to an exemplary embodiment illustrated in FIG. 13 may be able to process the signals received from the transmitting apparatus 1400, without having to include a parity deinterleaver (not illustrated) to correspond to the parity interleaver 1420.

First, the demodulator 1310 receives a signal transmitted from the transmitting apparatus 1400 and demodulates the same. To be specific, the demodulator 1310 generates values corresponding to an LDPC codeword by demodulating the received signal and output a result to the column twist deinterleaver 1320.

In one example, the value corresponding to the LDPC codeword may be expressed as a channel value with respect to the received signal. Various methods may be implemented to determine the channel value. For example, one of the methods may include an operation of determining an LLR value.

The LLR may be expressed as a logarithm of a ratio of likelihood that a bit transmitted from the transmitting apparatus 100 is 0 and likelihood that the bit is 1. Alternatively, the LLR value may itself be a value of a bit as determined by the hard decision, or the LLR value may be a representative value which is determined based on a section that includes a likelihood that a bit transmitted from the transmitting apparatus 100 is 0 or 1.

The column twist deinterleaver 1320 deinterleaves an output value from the demodulator 1310 and output a result to the decoder 1330. That is, the column twist deinterleaver 1320 may deinterleave LLR values output from the demodulator 1310.

To be specific, the column twist deinterleaver 1320 performs an operation corresponding to the column twist interleaver 1430 provided in the transmitting apparatus 1400. That is, the column twist deinterleaver 1320 may deinterleave LLR values corresponding to an information word and a parity, by reversely applying the interleaving rules that are used at the column twist interleaver 1430.

The decoder 1330 performs decoding, using output values from the deinterleaver 1320. That is, the decoder 1330 may perform LDPC decoding based on deinterleaved LLR values output from the deinterleaver 1320. To this end, the decoder 1330 may include an LDPC decoder for the LDPC decoding.

For example, the decoder 1330 may perform decoding using an iterative decoding algorithm based on a sum-product algorithm, as already has been explained in detail above with reference to FIG. 6.

In one example, a parity check matrix used during decoding at the decoder 1330 may have a structure which is permuted from a parity check matrix that is used during LDPC encoding at the encoder 1410. That is, the parity check matrix used during decoding at the decoder 1330 may have such a structure that a parity sub-matrix of the parity check matrix used during LDPC encoding at the encoder 1410 is column permutated according to an interleaving rule used at the parity interleaver.

Herebelow, for convenience of explanation, the parity check matrix used during LDPC encoding at the encoder 1410 will be referred to as a first parity check matrix, and the parity check matrix used for LDPC decoding at the decoder 1330 will be referred to as a second parity check matrix.

That is, the second parity check matrix may have a structure that is generated by column permuting a parity sub-matrix of the first parity check matrix so as to correspond to parity interleaving done at the parity interleaver 1420. For example, when the parity interleaving is performed at the parity interleaver 1420 based on Mathematical Formula 1, the second parity check matrix may have the same structure as that which is obtained by applying column permutation of Mathematical Formula 6 to the first parity check matrix. However, considering that row permutation does not influence algebraic characteristics of an LDPC code, the second parity check matrix may take a form that row permutation is additionally performed with respect to the first parity check matrix.

Figure 15A:
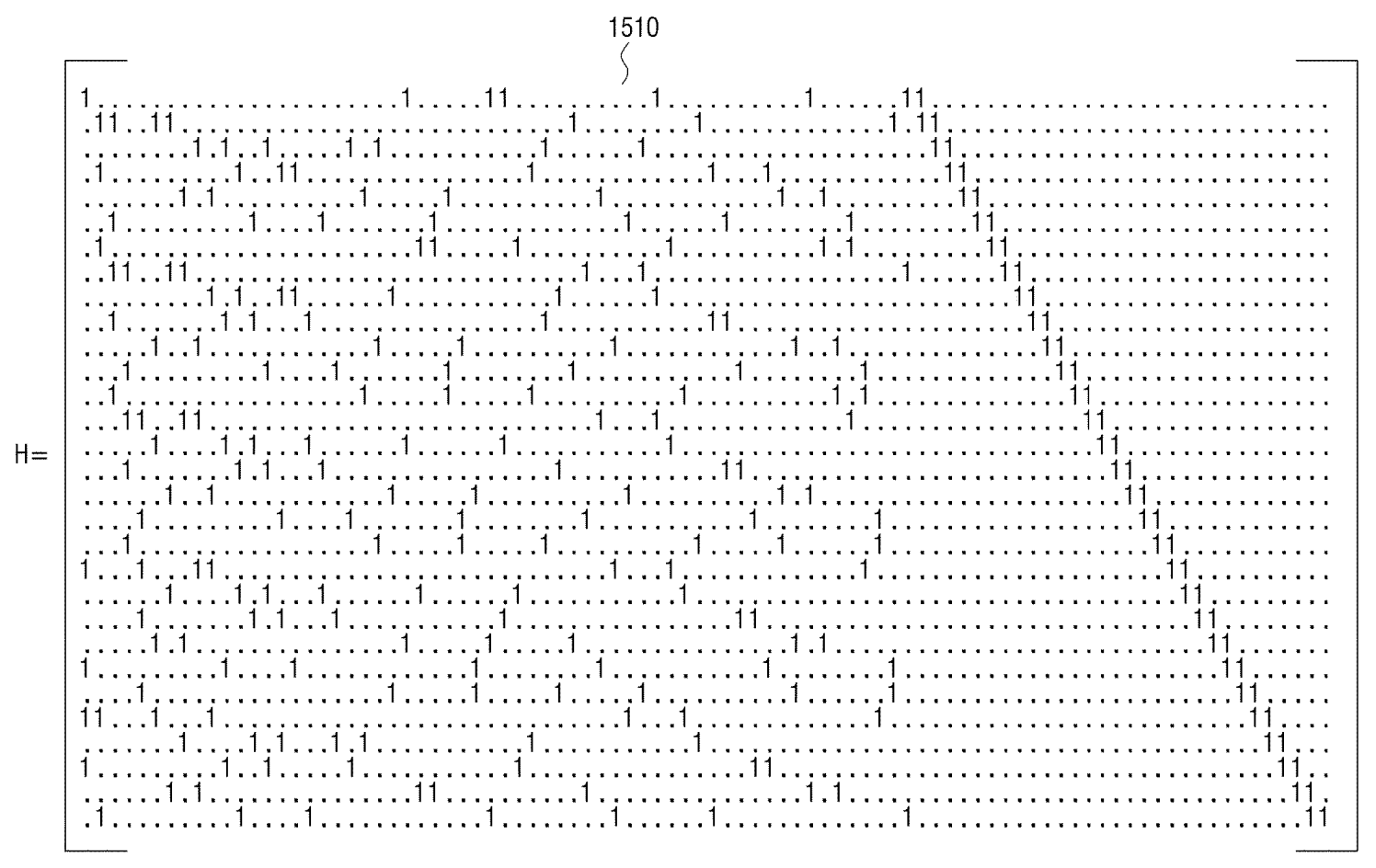

For example, it is assumed that a parity check matrix 1510 used during LDPC encoding at the encoder 1410 has a structure as illustrated in FIG. 15A.

Figure 15B:
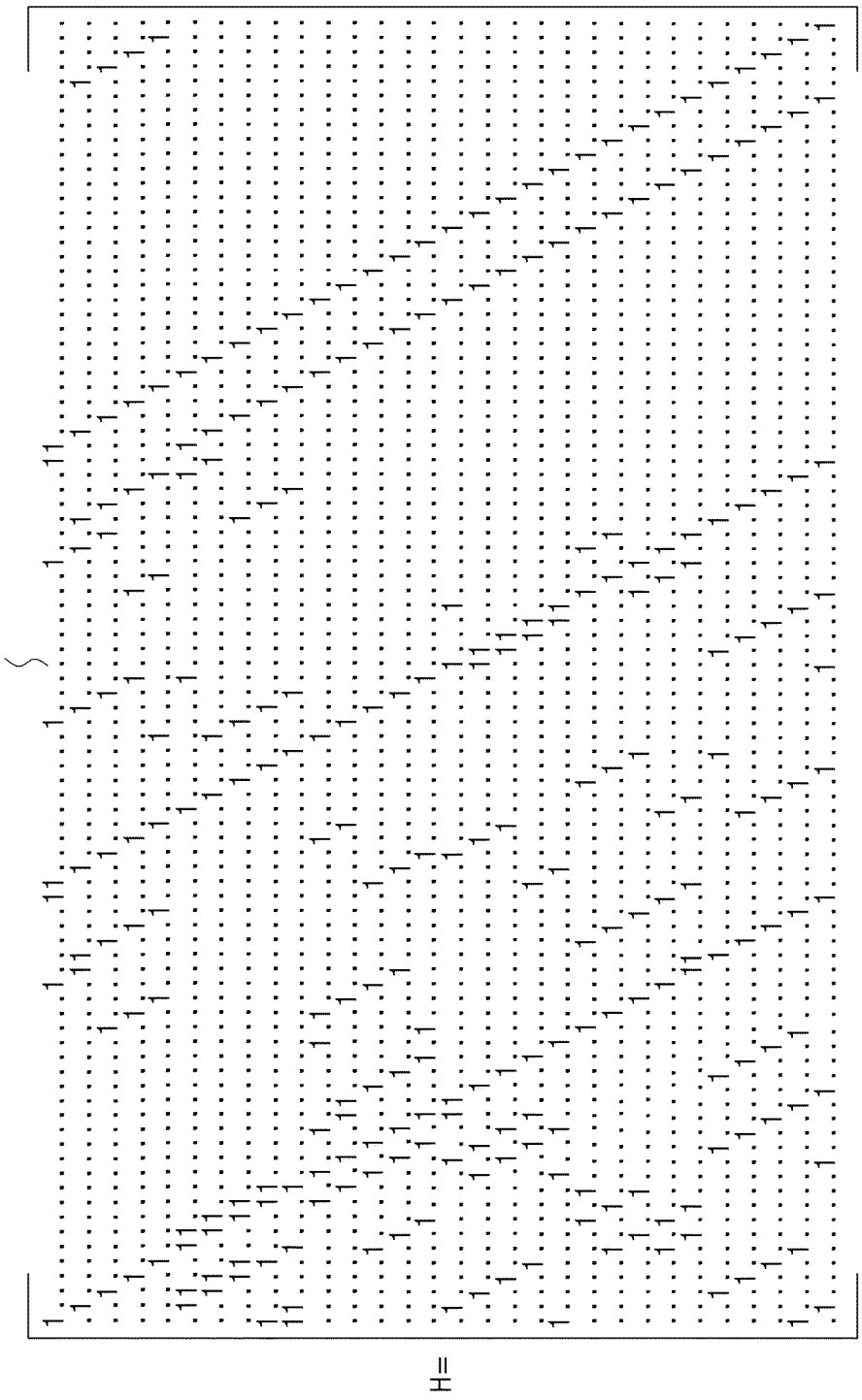

The decoder 1330 may perform decoding using a parity check matrix 1520 in FIG. 15B, i.e., a parity check matrix generated by row and column permutation on the parity check matrix 1510 in FIG. 15A. In one example, the column permutation may be performed on the parity sub-matrix of the parity check matrix 1510 based on the parity interleaving rule performed at the parity interleaver 1420, and the row permutation may be performed on the information word sub-matrix and the parity sub-matrix of the parity check matrix 1510.

Referring to the parity check matrix 1520 shown in FIG. 15B, each of a plurality of sub-groups constituting the parity sub-matrix of the parity check matrix 1520 has a quasi-cyclic form.

According to an exemplary embodiment, considering that the decoding is performed using the permuted parity check matrix to correspond to the parity interleaving performed at a transmitting side, it is unnecessary for the receiving side to separately include a parity deinterleaver.

Meanwhile, the decoder 1230 illustrated in FIG. 12 may also perform decoding using the parity check matrix permuted to correspond to the parity interleaving performed at the transmitting apparatus 100. That is, the decoder 1230 may perform decoding, using the parity check matrix which is generated after permuting the parity check matrix used during LDPC encoding at the encoder 110 to correspond to the parity interleaving performed at the interleaver 120.

Figure 16:
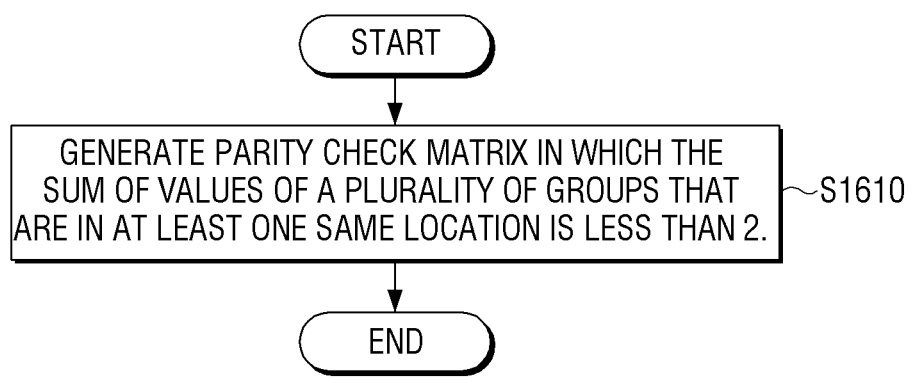
FIG. 16 is a flowchart provided to explain a parity check matrix generating method according to an exemplary embodiment.

FIG. 16 is a flowchart provided to explain a method for generating a parity check matrix according to an exemplary embodiment.

To be specific, a parity check matrix is generated, in which a sum of elements in same positions of a plurality of groups constituting a parity check matrix is less than 2, at S1610.

To be specific, the parity check matrix may be generated by performing row permutation and column permutations on a preset parity check matrix, dividing the permuted parity check matrix into a predetermined number of groups according to a modulation mode, and shifting at least one of sub-groups in at least one of the plurality of groups so that the sum of the elements in same positions of the plurality of groups is less than 2.

At least one of the sub-groups may be a matrix of a circulant permutation matrix structure.

Further, the plurality of groups may be generated by dividing a parity check matrix into a predetermined number of groups according to a modulation mode, and each of the sub-groups may be a matrix with a size obtained by dividing a difference between a length of an LDPC codeword generated based on the parity check matrix and a length of an information word constituting the LDPC codeword by a predetermined constant.

As explained above, row permutation and column permutation may be performed on the preset parity check matrix, but the inventive concept is not limited thereto. Accordingly, when the preset parity check matrix has a quasi-cyclic structure, it is possible to divide the preset parity check matrix into a predetermined number of groups according to a modulation mode without the row and column permutations, and shift elements in at least one of the sub-groups formed of columns corresponding to the information word bits in at least one of the groups included in the information word sub-matrix among the predetermined number of groups so that a sum of elements in same positions in the predetermined number of groups is less than 2.

The detailed method for generating the above parity check matrix has been explained above with reference to FIG. 4 and will not be redundantly explained below.

Figure 17:
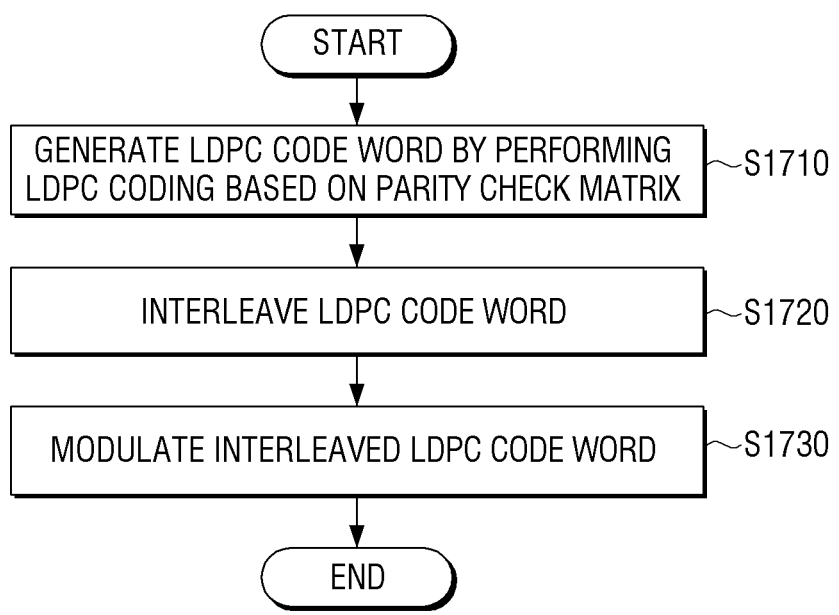
FIG. 17 is a flowchart provided to explain a signal processing method of a transmitting apparatus according to an exemplary embodiment.

FIG. 17 is a flowchart provided to explain a signal processing method of a transmitting apparatus according to an exemplary embodiment.

First, an LPDC codeword is generated by performing LDPC encoding based on a parity check matrix, at S1710.

After that, the LDPC codeword is interleaved, at S1720.

The interleaved LDPC codeword is then modulated, at S1730. It is possible to map the interleaved LDPC codeword to modulation symbols such that LDPC codeword bits corresponding to different parity check equations form one modulation symbol.

In one example, the parity check matrix used during the LDPC encoding may be a parity check matrix in which a sum of elements in same positions of a plurality of groups of the parity check matrix is less than 2.

To be specific, the parity check matrix may be generated by performing row permutation and column permutations on a preset parity check matrix, dividing the permuted parity check matrix into a predetermined number of groups according to a modulation mode, and shifting at least one of sub-groups in at least one of the plurality of groups so that the sum of the elements in same positions of the plurality of groups is less than 2.

At least one of the sub-groups may be a matrix of a circulant permutation matrix structure.

The plurality of groups may be generated by dividing a parity check matrix into a predetermined number of groups according to a modulation mode, and each of the sub-groups may be a matrix with a size obtained by dividing a difference between a length of an LDPC codeword generated based on the parity check matrix and a length of an information word constituting the LDPC codeword by a predetermined constant.

As explained above, row permutation and column permutation may be performed on the preset parity check matrix, but the inventive concept is not limited thereto. Accordingly, when the preset parity check matrix has a quasi-cyclic structure, it is possible to divide the preset parity check matrix into a predetermined number of groups according to a modulation mode without the row and column permutations, and shift elements in at least one of the sub-groups formed of columns corresponding to the information word bits in at least one of the groups included in the information word sub-matrix among the predetermined number of groups so that a sum of elements in same positions in the predetermined number of groups is less than 2.

The detailed method for generating the above parity check matrix has been explained earlier and will not be redundantly explained below.

An example of a parity check matrix may be defined as Table 7. That is, an information word sub-matrix of the parity check matrix may be defined as Table 7, and a parity sub-matrix may have a dual diagonal structure.

TABLE 9

| | index of row where 1 is located in the 0th column group of the ith column group |
|---|---|
| 0 | 20 712 2386 6354 4061 1062 5045 5158 |
| 1 | 21 2543 5748 4822 2348 3089 6328 5876 |
| 2 | 22 926 5701 269 3693 2438 3190 3507 |
| 3 | 48 1116 2827 3602 4474 4545 4692 5349 |
| 4 | 24 5140 2003 1263 4742 6497 1185 6202 |
| 5 | 25 4071 6959 |
| 6 | 26 91 2880 |
| 7 | 27 237 6719 |
| 8 | 28 1183 3464 |
| 9 | 29 3875 4447 |
| 10 | 30 315 5949 |
| 11 | 31 1492 4074 |

TABLE 9-continued

| | index of row where 1 is located in the 0th column of the ith column group |
|---|---|
| 12 | 32 2267 7845 |
| 13 | 33 3105 4631 |
| 14 | 34 4658 7902 |
| 15 | 35 3909 6893 |
| 16 | 36 5021 8960 |
| 17 | 37 789 3053 |
| 18 | 38 1082 6013 |
| 19 | 39 3475 7436 |

Table 9 has the same structure as Table 3 and is generated with the same method. Accordingly, redundant explanation will be omitted for the sake of brevity.

Figure 18:
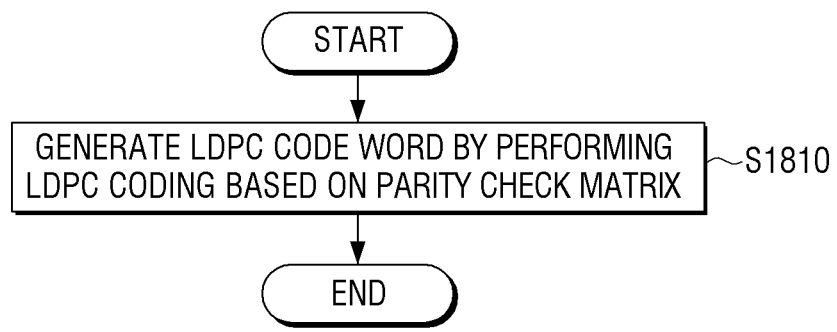
FIG. 18 is a flowchart provided to explain an encoding method of an encoding apparatus according to an exemplary embodiment.

FIG. 18 is a flowchart provided to explain an encoding method of an encoding apparatus according to an exemplary embodiment.

An LDPC codeword is generated by performing LDPC encoding based on a parity check matrix, at S1810.

In one example, the parity check matrix may be a parity check matrix in which a sum of elements in same positions of a plurality of groups of the parity check matrix is less than 2.

To be specific, the parity check matrix may be generated by performing row permutation and column permutations on a preset parity check matrix, dividing the permuted parity check matrix into a predetermined number of groups according to a modulation mode, and shifting at least one of sub-groups in at least one of the plurality of groups so that the sum of the elements in same positions of the plurality of groups is less than 2.

At least one of the sub-groups may be a matrix of a circulant permutation matrix structure.

The plurality of groups may be generated by dividing a parity check matrix into a predetermined number of groups according to a modulation mode, and each of the sub-groups may be a matrix with a size obtained by dividing a difference between a length of an LDPC codeword generated based on the parity check matrix and a length of an information word constituting the LDPC codeword by a predetermined constant.

As explained above, row permutation and column permutation may be performed on the preset parity check matrix, but the inventive concept is not limited thereto. Accordingly, when the preset parity check matrix has a quasi-cyclic structure, it is possible to divide the preset parity check matrix into a predetermined number of groups according to a modulation mode without the row and column permutations, and shift elements in at least one of the sub-groups formed of columns corresponding to the information word bits in at least one of the groups included in the information word sub-matrix among the predetermined number of groups so that a sum of elements in same positions in the predetermined number of groups is less than 2.

The detailed method for generating the above parity check matrix has been explained earlier and will not be redundantly explained below.

An example of a parity check matrix may be defined as Table 10. That is, an information word sub-matrix of the parity check matrix may be defined as Table 10, and a parity sub-matrix may have a dual diagonal structure.

TABLE 10

| | index of row where 1 is located in the 0th column of the ith column group |
|---|---|
| 0 | 20 712 2386 6354 4061 1062 5045 5158 |
| 1 | 21 2543 5748 4822 2348 3089 6328 5876 |
| 2 | 22 926 5701 269 3693 2438 3190 3507 |
| 3 | 48 1116 2827 3602 4474 4545 4692 5349 |
| 4 | 24 5140 2003 1263 4742 6497 1185 6202 |
| 5 | 25 4071 6959 |
| 6 | 26 91 2880 |
| 7 | 27 237 6719 |
| 8 | 28 1183 3464 |
| 9 | 29 3875 4447 |
| 10 | 30 315 5949 |
| 11 | 31 1492 4074 |
| 12 | 32 2267 7845 |
| 13 | 33 3105 4631 |
| 14 | 34 4658 7902 |
| 15 | 35 3909 6893 |
| 16 | 36 5021 8960 |
| 17 | 37 789 3053 |
| 18 | 38 1082 6013 |
| 19 | 39 3475 7436 |

Table 10 has the same structure as Table 3 and is generated with the same method. Accordingly, redundant explanation will be omitted for the sake of brevity.

Figure 19:
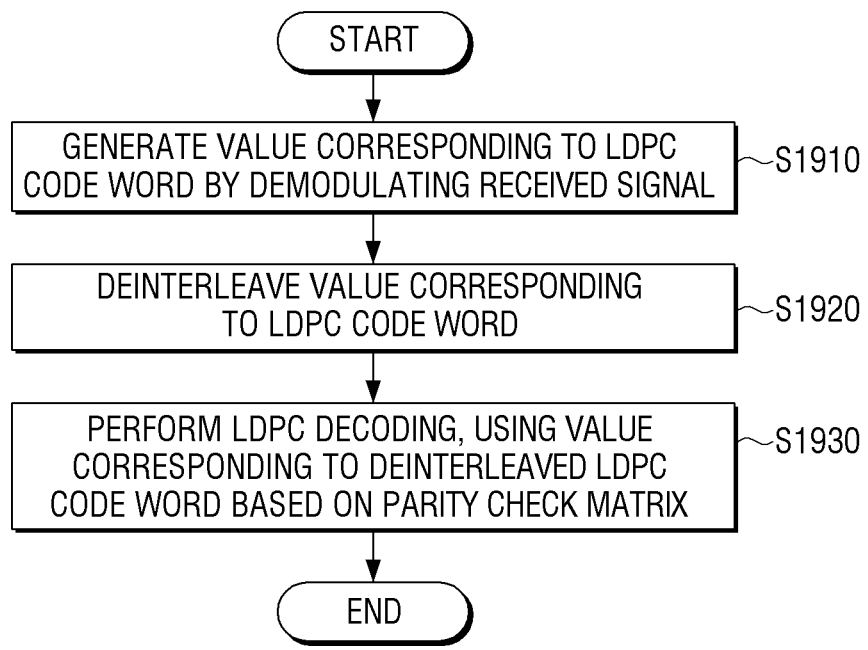
FIG. 19 is a flowchart provided to explain a signal processing method of a receiving apparatus according to an exemplary embodiment.

FIG. 19 is a flowchart provided to explain a signal processing method of a receiving apparatus according to an embodiment.

First, values corresponding to an LDPC codeword are generated by demodulating a received signal, at S1910. Regarding the received signal, LDPC codeword bits corresponding to different parity check equations may be mapped to one modulation symbol.

After that, the values corresponding to the LDPC codeword are deinterleaved, at S1920.

LDPC decoding is then performed, using the values corresponding to the deinterleaved LDPC codeword based on a parity check matrix, at S1930.

In one example, the parity check matrix used during LDPC decoding may be a parity check matrix in which a sum of elements in same positions of a plurality of groups of the parity check matrix is less than 2.

To be specific, the parity check matrix may be generated by performing row permutation and column permutations on a preset parity check matrix, dividing the permuted parity check matrix into a predetermined number of groups according to a modulation mode, and shifting at least one of sub-groups in at least one of the plurality of groups so that the sum of the elements in same positions of the plurality of groups is less than 2.

At least one of the sub-groups may be a matrix of a circulant permutation matrix structure.

The plurality of groups may be generated by dividing a parity check matrix into a predetermined number of groups according to a modulation mode, and each of the sub-groups may be a matrix with a size obtained by dividing a difference between a length of an LDPC codeword generated based on the parity check matrix and a length of an information word constituting the LDPC codeword by a predetermined constant.

As explained above, row permutation and column permutation may be performed on the preset parity check matrix, but the inventive concept is not limited thereto. Accordingly, when the preset parity check matrix has a quasi-cyclic structure, it is possible to divide the preset parity check matrix into a predetermined number of groups according to a modulation mode without the row and column permutations, and shift elements in at least one of the sub-groups formed of columns corresponding to the information word bits in at least one of the groups included in the information word sub-matrix among the predetermined number of groups so that a sum of elements in same positions in the predetermined number of groups is less than 2.

The detailed method for generating the above parity check matrix has been explained earlier and will not be redundantly explained below.

An example of a parity check matrix may be defined as Table 11. That is, an information word sub-matrix of the parity check matrix may be defined as Table 11, and a parity sub-matrix may have a dual diagonal structure.

TABLE 11

| | index of row where 1 is located in the 0th column of the ith column group |
|---|---|
| 0 | 20 712 2386 6354 4061 1062 5045 5158 |
| 1 | 21 2543 5748 4822 2348 3089 6328 5876 |
| 2 | 22 926 5701 269 3693 2438 3190 3507 |
| 3 | 48 1116 2827 3602 4474 4545 4692 5349 |
| 4 | 24 5140 2003 1263 4742 6497 1185 6202 |
| 5 | 25 4071 6959 |
| 6 | 26 91 2880 |
| 7 | 27 237 6719 |
| 8 | 28 1183 3464 |
| 9 | 29 3875 4447 |
| 10 | 30 315 5949 |
| 11 | 31 1492 4074 |
| 12 | 32 2267 7845 |
| 13 | 33 3105 4631 |
| 14 | 34 4658 7902 |
| 15 | 35 3909 6893 |
| 16 | 36 5021 8960 |
| 17 | 37 789 3053 |
| 18 | 38 1082 6013 |
| 19 | 39 3475 7436 |

Table 11 has the same structure as Table 3 and is generated with the same method. Accordingly, redundant explanation will be omitted for the sake of brevity.

Figure 20:
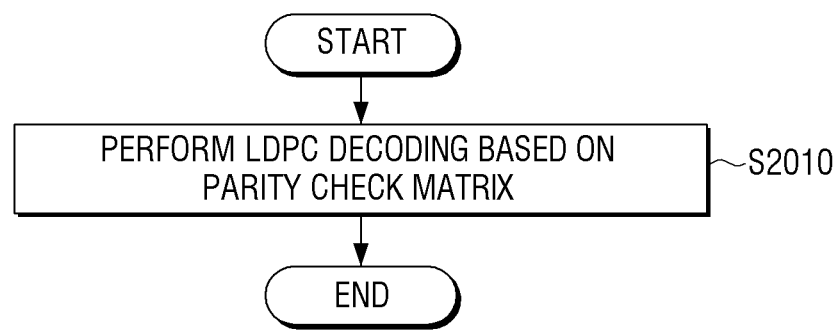
FIG. 20 is a flowchart provided to explain a decoding method of a decoding apparatus according to an exemplary embodiment.

FIG. 20 is a flowchart provided to explain a decoding method of a decoding apparatus according to an exemplary embodiment.

The decoding method includes performing LDPC decoding based on a parity check matrix, at S2010.

In one example, the parity check matrix may be a parity check matrix in which a sum of elements in same positions of a plurality of groups of the parity check matrix is less than 2.

To be specific, the parity check matrix may be generated by performing row permutation and column permutations on a preset parity check matrix, dividing the permuted parity check matrix into a predetermined number of groups according to a modulation mode, and shifting at least one of sub-groups in at least one of the plurality of groups so that the sum of the elements in same positions of the plurality of groups is less than 2.

At least one of the sub-groups may be a matrix of a circulant permutation matrix structure.

The plurality of groups may be generated by dividing a parity check matrix into a predetermined number of groups according to a modulation mode, and each of the sub-groups may be a matrix with a size obtained by dividing a difference between a length of an LDPC codeword generated based on the parity check matrix and a length of an information word constituting the LDPC codeword by a predetermined constant.

As explained above, row permutation and column permutation may be performed on the preset parity check matrix, but the inventive concept is not limited thereto. Accordingly, when the preset parity check matrix has a quasi-cyclic structure, it is possible to divide the preset parity check matrix into a predetermined number of groups according to a modulation mode without the row and column permutations, and shift elements in at least one of the sub-groups formed of columns corresponding to the information word bits in at least one of the groups included in the information word sub-matrix among the predetermined number of groups so that a sum of elements in same positions in the predetermined number of groups is less than 2.

The detailed method for generating the above parity check matrix has been explained earlier and will not be redundantly explained below.

An example of a parity check matrix may be defined as Table 11. That is, an information word sub-matrix of the parity check matrix may be defined as Table 11, and a parity sub-matrix may have a dual diagonal structure.

TABLE 12

| | index of row where 1 is located in the 0th column of the ith column group |
|---|---|
| 0 | 20 712 2386 6354 4061 1062 5045 5158 |
| 1 | 21 2543 5748 4822 2348 3089 6328 5876 |
| 2 | 22 926 5701 269 3693 2438 3190 3507 |
| 3 | 48 1116 2827 3602 4474 4545 4692 5349 |
| 4 | 24 5140 2003 1263 4742 6497 1185 6202 |
| 5 | 25 4071 6959 |
| 6 | 26 91 2880 |
| 7 | 27 237 6719 |
| 8 | 28 1183 3464 |
| 9 | 29 3875 4447 |
| 10 | 30 315 5949 |
| 11 | 31 1492 4074 |
| 12 | 32 2267 7845 |
| 13 | 33 3105 4631 |
| 14 | 34 4658 7902 |
| 15 | 35 3909 6893 |
| 16 | 36 5021 8960 |
| 17 | 37 789 3053 |
| 18 | 38 1082 6013 |
| 19 | 39 3475 7436 |

Table 12 has the same structure as Table 3 and is generated with the same method. Accordingly, redundant explanation will be omitted for the sake of brevity.

Meanwhile, a non-transitory computer readable medium may be provided, storing therein a program to implement each of the above-described methods, according to an exemplary embodiment.

The non-transitory computer readable recording medium may refer to a medium which stores data semi-permanently and can be read by devices, rather than a medium storing data temporarily such as register, cache, or memory. Specifically, the above various applications or programs may be stored and provided in the non-transitory computer readable recording medium such as compact disc (CD), digital versatile disc (DVD), hard disk, Blu-ray disk, universal serial bus (USB), memory card, or read-only memory (ROM).

At least one of the components, elements or units represented by a block as illustrated in FIGS. 1 and 8-14 may be embodied as various numbers of hardware, software and/or firmware structures that execute respective functions described above, according to an exemplary embodiment. For example, at least one of these components, elements or units may use a direct circuit structure, such as a memory, processing, logic, a look-up table, etc. that may execute the respective functions through controls of one or more microprocessors or other control apparatuses. Also, at least one of these components, elements or units may be specifically embodied by a module, a program, or a part of code, which contains one or more executable instructions for performing specified logic functions, and executed by one or more microprocessors or other control apparatuses. Also, at least one of these components, elements or units may further include a processor such as a central processing unit (CPU) that performs the respective functions, a microprocessor, or the like. Two or more of these components, elements or units may be combined into one single component, element or unit which performs all operations or functions of the combined two or more components, elements of units. Also, at least part of functions of at least one of these components, elements or units may be performed by another of these components, element or units. Further, although a bus is not illustrated in the above block diagrams, communication between the components, elements or units may be performed through the bus. Functional aspects of the above exemplary embodiments may be implemented in algorithms that execute on one or more processors. Furthermore, the components, elements or units represented by a block or processing steps may employ any number of related art techniques for electronics configuration, signal processing and/or control, data processing and the like.

Further, the foregoing exemplary embodiments and advantages are merely exemplary and are not to be construed as limiting the inventive concept. The present teaching can be readily applied to other types of apparatuses. Also, the description of the exemplary embodiments of the present inventive concept is intended to be illustrative, and not to limit the scope of the claims.

What is claimed is:

1. A data processing method comprising:
   encoding information word bits to generate parity bits based on a parity check matrix of a low density parity check (LDPC) code;
   interleaving a codeword comprising the input bits and the parity bits; and
   mapping the interleaved codeword into constellation points,
   wherein each of the constellation points corresponds to a modulation symbol,
   wherein the parity check matrix is divided into a plurality of group based on a number of bits included in the modulation symbol, and
   wherein a sum of elements at a same position in each of the plurality of groups is less than 2.

2. The data processing method of claim 1, wherein the parity check matrix is constituted by 0 or 1 as its element.

3. The data processing method of claim 2, wherein bits of the codeword corresponding to different parity check equations are mapped to a same modulation symbol, and
   wherein each of the parity check equations corresponds to columns where 1 exists in a row of the parity check matrix.

4. The data processing method of claim 1, further comprising generating the parity check matrix by:
   performing row permutation and column permutation on a preset parity check matrix;
   dividing the parity check matrix, on which the row permutation and the column permutation are performed, into the plurality of groups according to the number of bits included in the modulation symbol;
   dividing each of the plurality of groups into a plurality of sub-groups; and
   shifting elements of at least one sub-group among the plurality of sub-groups corresponding to the information word bits until the sum of elements at the same positions in each of the plurality of groups is less than 2.

5. The data processing method of claim 4, wherein the at least one of the sub-groups comprises a matrix having a circulant permutation matrix structure.

6. The data processing method of claim 4,
   wherein each of the plurality of sub-groups comprises a matrix having a size obtained by dividing a difference between a number of bits of the codeword and a number of the information word bits by a predetermined constant.

7. A data processing apparatus comprising:
   an encoder configured to encode information word bits to generate parity bits based on a parity check matrix of a low density parity check (LDPC) code;
   an interleaver configured to interleave a codeword comprising the input bits and the parity bits; and
   a mapper configured to map the interleaved codeword into constellation points,
   wherein each of constellation points corresponds to a modulation symbol,
   wherein in the parity check matrix is divided to a plurality of groups based on a number of bits included in the modulation symbol, and
   wherein a sum of elements of a same position in each of the plurality of groups is less than 2.

8. The data processing apparatus of claim 7, wherein the parity check matrix is constituted by 0 or 1 as its element.

9. The data processing apparatus of claim 8 wherein bits of the codeword corresponding to different parity check equations are mapped to a same modulation symbol, and
   wherein each of the parity check equations corresponds to columns where 1 exists in a row of the parity check matrix.

10. The data processing apparatus of claim 7, wherein the parity check matrix is generated by:
    performing row permutation and column permutation on a preset parity check matrix;
    dividing the parity check matrix into the plurality of groups according to the number of bits included in the modulation symbol;
    dividing each of the plurality of group into a plurality of sub-groups; and
    shifting elements of at least one sub-group among the plurality of sub-groups corresponding to the information word bits until the sum of elements at the same positions in each of the plurality of groups is less than 2.

11. The data processing apparatus of claim 10, wherein the at least one of the sub-groups comprises a matrix having a circulant permutation matrix structure.

12. The data processing apparatus of claim 10,
    wherein each of the plurality of sub-groups comprises a matrix having a size obtained by dividing a difference between a number of bits of the codeword and a number of the information word bits by a predetermined constant.

13. A data processing apparatus comprising:
    a demodulator configured to receive and demodulate a signal comprising a plurality of modulation symbols from a transmitting apparatus;

deinterleaver configured to deinterleave the demodulated signal; and a decoder configured to decode the deinterleaved signal based on a parity check matrix of a low density parity check (LDPC) code, wherein the transmitting apparatus maps a codeword comprising information word bits and parity bits into the plurality of modulation symbol, wherein in the parity check matrix is divided to a plurality of groups based on a number of bits include in a modulation symbol, and wherein a sum of elements at a same position in each of the plurality of groups is less than 2.

14. The data processing apparatus of claim 13, wherein the parity check matrix is generated by:

performing row permutation and column permutation on a preset parity check matrix;

dividing the parity check matrix into the plurality of groups according to the number of bits included in the modulation symbol;

dividing each of the plurality of groups into a plurality of sub-groups; and shifting elements of at least one sub-group among the plurality of sub-groups corresponding to the information word bits until the sum of elements at the same positions in each of the plurality of groups is less than 2.

15. The data processing apparatus of claim 13, wherein the at least one of the sub-groups comprises a matrix having a circulant permutation matrix structure.

16. The data processing apparatus of claim 13, wherein each of the plurality of sub-groups comprises a matrix having a size obtained by dividing a difference between a number of bits of the codeword and a number of the information word bits by a predetermined constant.

17. A data processing method comprising:

receiving and demodulating a signal comprising a plurality of modulation symbols from a transmitting apparatus;

deinterleaving the demodulated signal; and decoding the deinterleaved signal based on a parity check matrix of a low density parity cheek (LDPC) code, wherein the transmitting apparatus maps a codeword comprising information word bits and parity bits into the plurality of modulation symbols, wherein the parity check matrix is divided to plurality of groups based on a number of bits included in a modulation symbol, and wherein a sum of elements at a same position in each of the plurality of groups is less than 2.

18. The data processing method of claim 17, wherein the parity check matrix is generated by:

performing row permutation and column permutation on a preset parity check matrix;

dividing the parity check matrix into the plurality of groups according to the number of bits included in the modulation symbol;

dividing each of the plurality of groups into a plurality of sub-groups; and shifting elements of at least one sub-groups among the plurality of sub-groups corresponding to the information word bits until the sum of elements at the same positions in each of the plurality of groups is less than 2.

19. The data processing method of claim 18, wherein the at least one of the sub-groups comprises a matrix having a circulant permutation matrix structure.

20. The data processing method of claim 18, wherein each of the plurality of sub-groups comprises a matrix having a size obtained by dividing a difference between a number of bits of the codeword and a number of the information word bits by a predetermined constant.

* * * * *